US008154128B2

(12) United States Patent
Lung

(10) Patent No.: US 8,154,128 B2
(45) Date of Patent: Apr. 10, 2012

(54) 3D INTEGRATED CIRCUIT LAYER INTERCONNECT

(75) Inventor: Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 301 days.

(21) Appl. No.: 12/579,192

(22) Filed: Oct. 14, 2009

(65) Prior Publication Data

US 2011/0084397 A1   Apr. 14, 2011

(51) Int. Cl.
*H01L 23/48* (2006.01)
*H01L 23/52* (2006.01)

(52) U.S. Cl. .................. 257/758; 257/211; 257/E23.145
(58) Field of Classification Search .................. 257/211, 257/758, 760, 744, E23.145
See application file for complete search history.

(56) References Cited

U.S. PATENT DOCUMENTS

| | | | |
|---|---|---|---|
| 6,034,882 | A | 3/2000 | Johnson et al. |
| 6,906,940 | B1 | 6/2005 | Lue |
| 6,989,602 | B1 * | 1/2006 | Lytle ............................ 257/773 |
| 7,081,377 | B2 | 7/2006 | Cleeves |
| 7,129,538 | B2 | 10/2006 | Lee et al. |
| 7,177,169 | B2 | 2/2007 | Scheuerlein |
| 2005/0280061 | A1 | 12/2005 | Lee |
| 2008/0101109 | A1 | 5/2008 | Haring-Bolivar et al. |
| 2009/0097321 | A1 | 4/2009 | Kim et al. |
| 2009/0184360 | A1 | 7/2009 | Jin et al. |
| 2010/0270593 | A1 | 10/2010 | Lung et al. |

FOREIGN PATENT DOCUMENTS

| | | |
|---|---|---|
| EP | 1936681 A1 | 6/2008 |
| EP | 2048709 A2 | 4/2009 |

OTHER PUBLICATIONS

Johnson et al., "512-Mb PROM With a Three-Dimensional Array of Diode/Anti-fuse Memory Cells" IEEE J. of Solid-State Circuits, vol. 38, No. 11, Nov. 2003.
Jung et al., "Three Dimensionally Stacked NAND Flash Memory Technology Using Stacking Single Crystal Si Layers on ILD and TANOS Structure for Beyond 30nm Node", IEEE Int'l Electron Devices Meeting, Dec. 11-13, 2006.
Kim, Jiyoung et al., "Novel 3-D Structure for Ultra High Density Flash Memory with VRAT (Vertical-Recess-Array-Transistor) and PIPE (Planarized Integration on the same PlanE)," Jun. 17-19, 2008, 2 pages.
Lai, et al., "A Multi-Layer Stackable Thin-Film Transistor (TFT) NAND-Type Flash Memory", IEEE Int'l Electron Devices Meeting, Dec. 11-13, 2006.
Lung, Hsiang-Lan, "Integrated Circuit 3D Memory Array and Manufacturing Method," U.S. Appl. No. 12/430,290, filed Apr. 27, 2009.
Lung, Hsiang-Lan, et al., U.S. Appl. No. 12/430,290 entitled "Integrated Circuit 3D Memory Array and Manufacturing Method," filed on Apr. 27, 2009, 44 pages.
Tanaka, H., et al., "Bit Cost Scalable Technology with Punch and Plug Process for Ultra High Density Flash Memory," 2007 IEEE Symposium on VLSI Technology, Jun. 12-14, 2007, pp. 14-15.

(Continued)

*Primary Examiner* — Hoai V Pham
(74) *Attorney, Agent, or Firm* — Haynes Beffel & Wolfeld LLP

(57) ABSTRACT

A three-dimensional 3D interconnect structure with a small footprint is described, useful for connection from above to levels of circuit structures in a multi-level device. Also, an efficient and low cost method for manufacturing the 3D interconnect structure is provided.

8 Claims, 27 Drawing Sheets

OTHER PUBLICATIONS

Lai et al., "Highly Reliable MA BE-SONOS (Metal Al2O3 Bandgap Engineered SONOS) Using a SiO2 Buffer Layer", VLSI Technology, Systems and Applications, International Symposium on Apr. 21-23, 2008, p. 58-59.

Choi et al., "Performance Breakthrough in NOR Flash Memory with Dopant-Segregated Schottky-Barrier (DSSB) SONOS Devices", 2009 Symposium on VLSI Technology Digest of Technical Papers, p. 222-223.

Paul et al., "Impact of a Process Variation on Nanowire and Nanotube Device Performance", IEEE Transactions on Electron Devices, vol. 54, No. 9, Sep. 2007, p. 2369-2376.

Katsumata et al., "Pipe-shaped BiCS Flash Memory with 16 Stacked Layers and Multi-Level-Cell Operation for Ultra High Density Storage Devices", 2009 Sypmposium on VLSI technology Digest of Technical Papers, p. 136-137.

Jang et al., "Vertical Cell Array using TCAT(Terabit Cell Array Transistor) Technology for Ultra High Density NAND Flash Memory", 2009 Symposium on VLSI Technology Digest of Technical Papers, p. 192-193.

Kim et al., "Multi-Layered Vertical Gate NAND Flash Overcoming Stacking Limit for Terabit Density Storage", 2009 Symposium on VLSI Technology Digest of Technical Papers, p. 188-189.

Lue et al., "A Novel Buried-Channel FinFET Be-SONOS NAND Flash with Improved Memory Window and Cycling Endurance", 2009 Symposium on VLSI Technology Digest of Technical Papers, p. 224-225.

Hubert et al., "A Stacked SONOS technology, up to 4 levels and 6nm crystalline nanowires, with gate-all-around or independent gates (F Flash), suitable for full 3D integration", IEEE IEDM, Dec. 7-9, 2009, 2 pages.

Hsu et al., "Study of Sub-30nm Thin Film Transistor (TFT) Charge-Trapping (CT) Devices for 3D NAND Flash Application", IEDM 2009 IEEE International, Dec. 7-9, 2009, p. 1-4.

\* cited by examiner

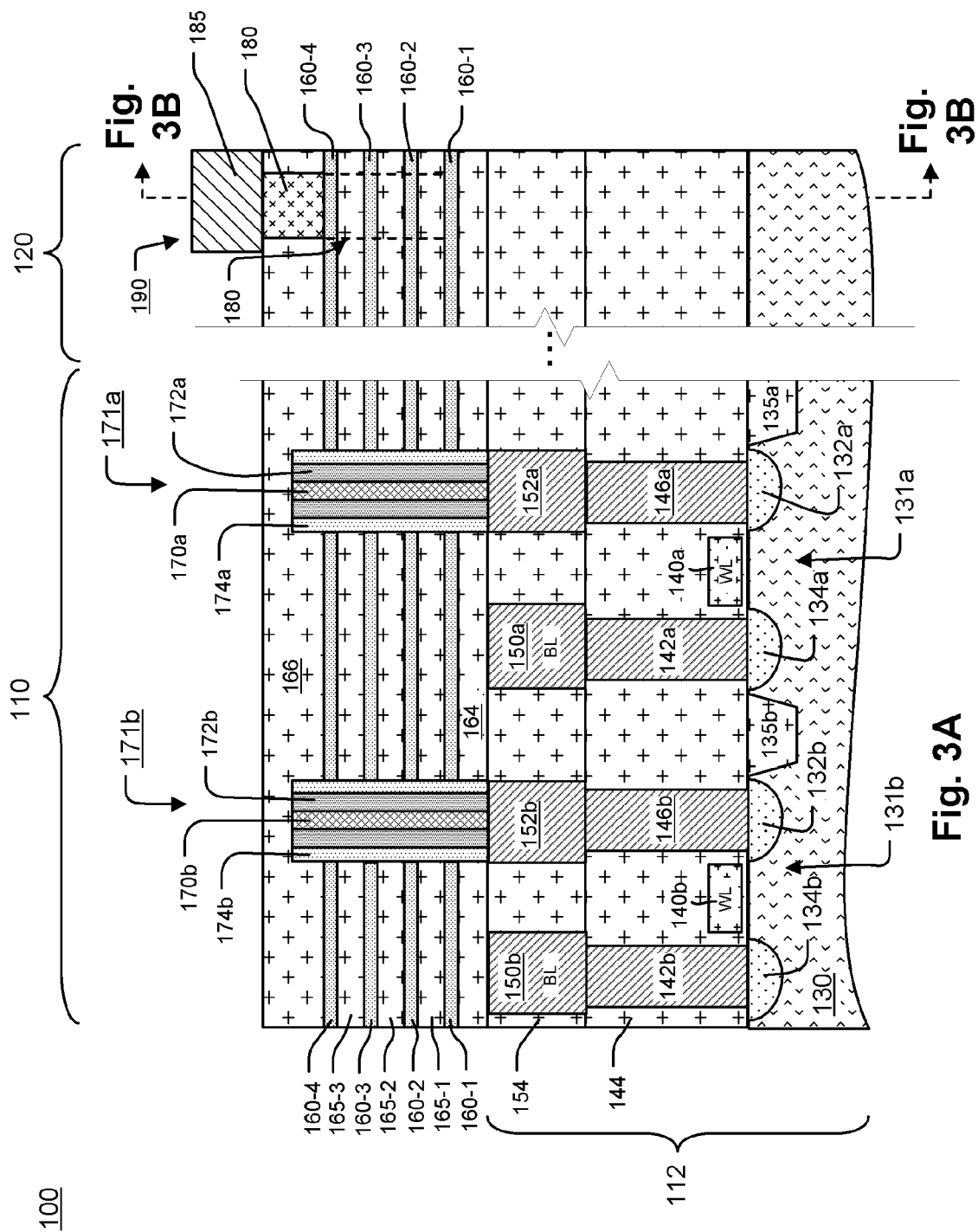

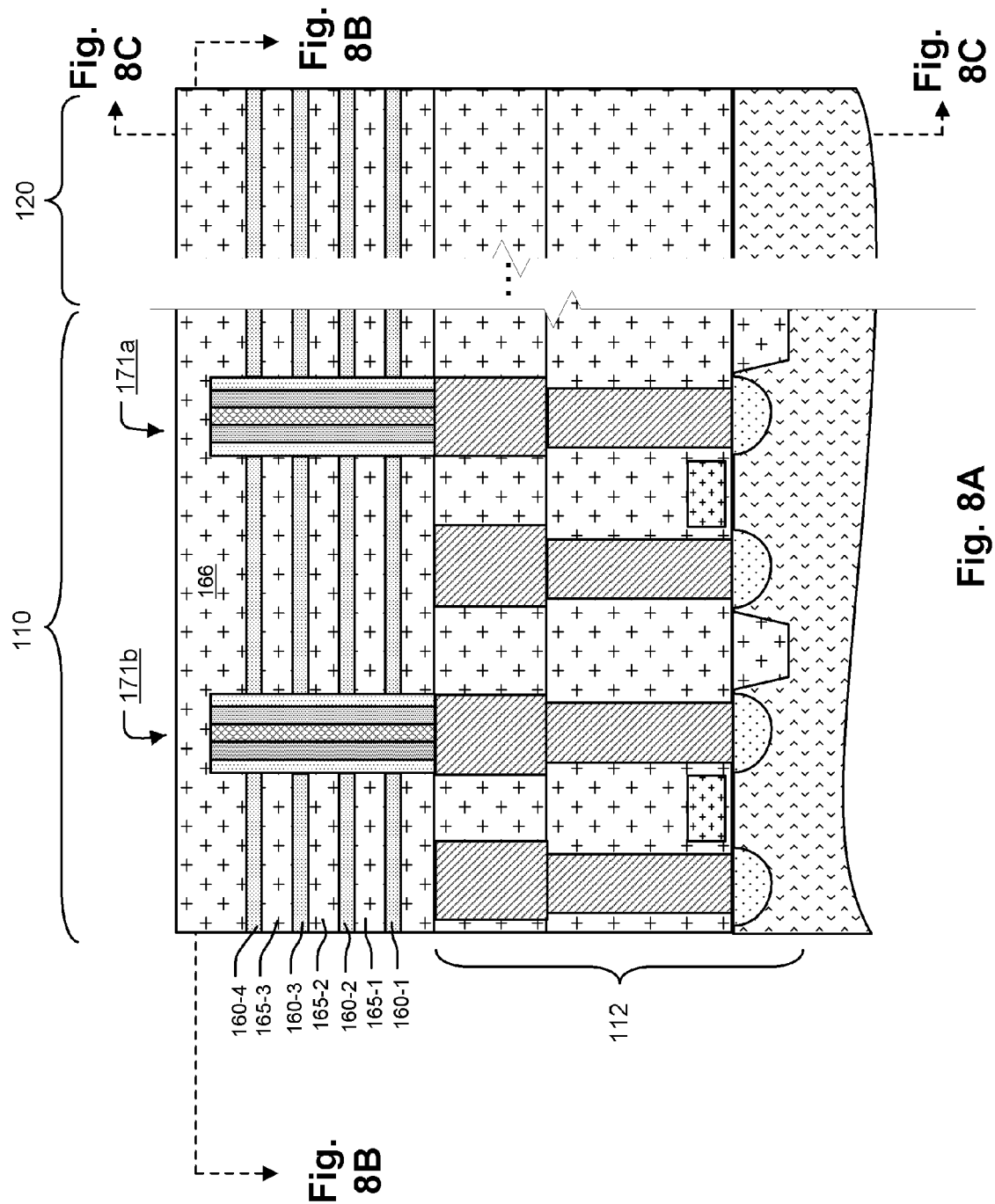

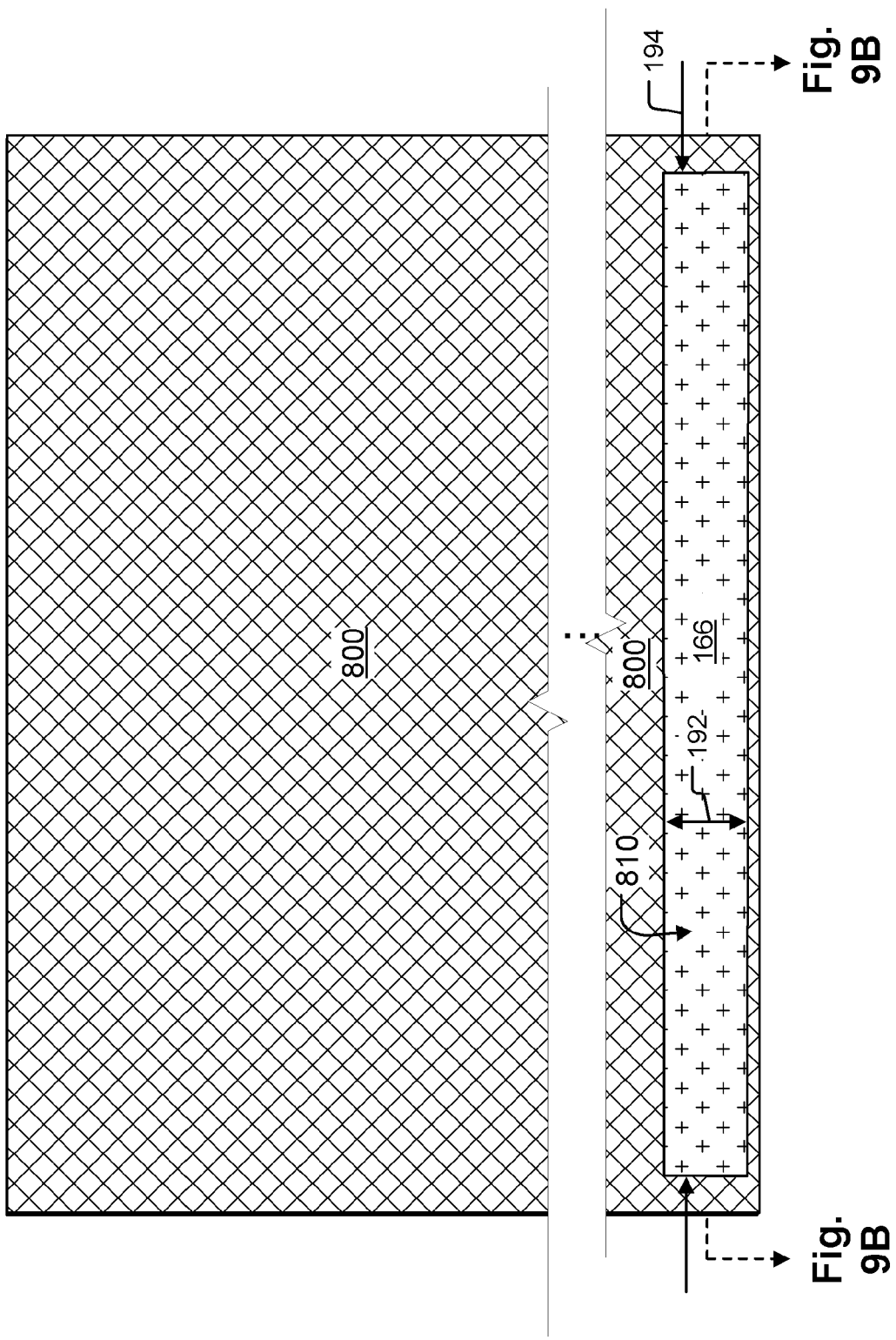

3D INTEGRATED CIRCUIT LAYER INTERCONNECT

BACKGROUND OF THE INVENTION

1. Field of the Invention

The present invention relates generally to high density integrated circuit devices, and more particularly to interconnect structures for multi-level three-dimensional stacked devices.

2. Description of Related Art

In the manufacturing of high density memory devices, the amount of data per unit area on an integrated circuit can be a critical factor. Thus, as the critical dimensions of the memory devices approach lithographic technology limits, techniques for stacking multiple levels of memory cells have been proposed in order to achieve greater storage density and lower costs per bit.

For example, thin film transistor techniques are applied to charge trapping memory in Lai, et al., "A Multi-Layer Stackable Thin-Film Transistor (TFT) NAND-Type Flash Memory", IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node", IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, vol. 38, no. 11, November 2003. See, also U.S. Pat. No. 7,081,377 to Cleeves entitled "Three-Dimensional Memory".

Another structure that provides vertical NAND cells in a charge trapping memory technology is described in "Novel 3-D Structure for Ultra-High Density Flash Memory with VRAT and PIPE" by Kim et al., 2008 Symposium on VLSI Technology Digest of Technical Papers"; 17-19 Jun. 2008; pages 122-123.

In three-dimensional stacked memory devices, conductive interconnects used to couple the lower levels of memory cells to decoding circuitry and the like pass through the upper levels. The footprint or plan view area of these interconnects can significantly reduce the amount of area available for memory cells in the upper levels. Also, the cost to implement the interconnections increases with the number of lithographic steps needed. One approach to reduce the number of lithographic steps is described in Tanaka et al., "Bit Cost Scalable Technology with Punch and Plug Process for Ultra High Density Flash Memory", 2007 Symposium on VLSI Technology Digest of Technical Papers; 12-14 Jun. 2007; pages 14-15.

However, in the structure described in Tanaka et al., the size of each succeeding level in the stack is smaller than the lower levels. This results in significantly smaller memory areas in the upper levels, reducing the memory density and increasing the cost per bit. Also, there is a practical limit to the number of levels that can be layered in this way. Thus, although the benefits of higher density are achieved using three-dimensional stacked memory, the reduced memory density and resulting higher per bit manufacturing costs for the upper layers limit the use of the technology.

It is therefore desirable to provide three-dimensional 3D stacked devices with an interconnect structure for the multiple levels having a very small footprint, as well as methods for manufacturing such devices that can be carried out at lower costs.

SUMMARY OF THE INVENTION

A 3D interconnect structure with a small footprint is described, useful for connection from above to levels of circuit structures in a multi-level device. Also, an efficient and low cost method for manufacturing the 3D interconnect structure is provided.

A device described herein comprises a three-dimensional structure including a plurality of levels of circuit structures, including levels 0 to N, where N is at least 2.

The bottom level and each overlying level up to the next to top level, that is level (i), for (i) equal to 0 through N−1, include respective landing areas for contact with conductors extending to or above the top level N in the plurality of levels. The landing area (i) on each level (i) has a length in a longitudinal direction and a width in a transverse direction, which can be, but need not be, the same for each level.

The first level above the bottom level and each overlying level up to the top level have respective openings over landing areas on levels below. The openings in each level, with the exception of the top level, are adjacent their respective landing areas. In the top level, the opening need not be adjacent its landing area, but can be for ease of layout planning. That is, level (i) overlying level (i−1), for (i) equal to 1 through N−1, has an opening (i) adjacent the landing area (i) on level (i). The opening in the first level extends over the landing area on the bottom level, and the opening in each overlying level extends over the opening and the landing area on the immediately preceding level. That is, the opening (i) in level (i) extends over the landing area (i−1) on level (i−1), and for (i) greater than 1, over the adjacent opening (i−1) in level (i−1). The openings in each succeeding level are aligned on the transverse sidewalls and on the distal longitudinal sidewalls (or outside sidewalls) with the openings in the immediately underlying levels, and have proximal sidewalls (or inside sidewalls) aligned with the landing areas on the immediately underlying levels. That is, the opening (i) has a distal longitudinal sidewall aligned with the distal longitudinal sidewall of opening (i−1) in level (i), and a proximal longitudinal sidewall defining a length of the opening (i). The length of the opening (i) is at least as large as the length of the landing area (i−1) plus the length of the opening (i−1), if any. For (i) greater than 1, the opening (i) has transverse sidewalls aligned with the transverse sidewalls of opening (i−1) in level (i−1) and defines a width of the opening (i) at least as large as the width of the landing area (i−1).

Insulating fill is within the openings in levels 1 to N. Conductors extend through the insulating fill in the openings to contact the landing areas on levels 0 to N−1, used for example for coupling the levels to decoding circuitry by a wiring layer overlying the levels.

A method for manufacturing a device as described herein comprises forming a three-dimensional structure including a plurality of levels, including levels 0 to N, where N is at least 2. The bottom level and each overlying level up to the next to top level, that is level (i), for (i) equal to 0 through N−1, include respective landing areas for contact with conductors extending to or above the top level N in the plurality of levels. The landing area (i) has a length in a longitudinal direction and a width in a transverse direction.

A first mask is formed having an opening overlying the landing areas on the plurality of levels. The opening in the first mask surrounds the perimeter of the combination of landing areas, and thus has a length in the longitudinal direction at least as large as a sum of the lengths of the landing areas (i), for (i) equal to 0 through N−1. The opening in the first mask has a width overlying landing area (i) on level (i), for (i) equal to 0 through N−1, at least as large as the width of the landing area (i) on level (i);

A second mask is formed over the opening in the first mask. The second mask has a length in the longitudinal direction less than the length of the opening in the first mask by an amount based on the size of the landing area or areas on the bottom layer, and has a width in the transverse direction at least as large as the width of the opening in the first mask.

The process then iteratively (a) etches the layers using the first and second etch masks, and (b) reduces the length of the second etch mask based on the size of the next landing area, so that openings are formed in the various levels in a self-aligned manner. That is, the process iterates, over (j) from 0 through N−1, the steps of etching using the first and second masks as etch masks, thereby forming an opening overlying the landing area (j) on level (j); and reducing the length of the second mask within the opening in the first mask by the length of the landing area (j+1) on level (j+1). The index "j" is then incremented, and the etching and reducing is repeated for j less than or equal to N−1.

Insulating fill material is then formed within the openings in levels 1 to N. Conductors are then formed extending through the insulating fill in the openings to contact the landing areas on levels 0 to N−1.

A method for manufacturing a device as described alternatively herein includes forming a plurality of levels having respective landing areas for contact with conductors. The landing areas have respective lengths in a longitudinal direction and respective widths in a transverse direction. The forming of the plurality of levels includes forming a first level, forming a second level overlying the first level, and forming a third level overlying the second level.

A first mask is formed overlying the plurality of levels. The first mask has an opening with a length in the longitudinal direction and a width in the transverse direction, the opening defining the perimeter of the interconnect structure. The length of the opening in the first mask is at least as large as the sum of the lengths of the landing areas on the first, second and third levels. The width of the opening in the first mask overlying the landing area on a given level in the plurality of levels is at least as large as the width of the landing area on said given level.

A second mask is formed over the opening in the first mask. The second mask has a length in the longitudinal direction less than the length of the opening in the first mask, and has a width in the transverse direction at least as large as the width of the opening in the first mask.

The third level is etched using the first and second masks as etch masks, thereby forming a first opening in the third level. The first opening has a width at least as large as the width of the landing area on the first level, and has a length at least as large as the length of the landing area on the first level. The length of the second mask is then reduced to form a third mask.

The second and third levels are then etched using the first and third masks as etch masks. This etching extends the first opening through the second level, and forms a second opening in the third level adjacent the first opening. The second opening overlies the landing area on the second level. The second opening has a width at least as large as the width of the landing area on the second level, and has a length at least as large as the length of the landing area on the second level.

Conductors are then formed extending through vias in the first and second openings to contact the landing areas on the first and second levels.

The footprint of the interconnect structure in embodiments described herein can be defined by the opening in a single etch mask. Openings in the various levels used for passing conductors to the landing areas on underlying levels are formed by patterning the levels using one additional mask formed over the opening in the first mask, as well as processes for etching the additional mask without a critical alignment step. As a result the openings are formed in a self-aligned manner within a very small area. In addition, the vias for the conductors can be patterned at the same time. As a result, there is no need for a mask for each layer, thereby reducing cost.

Examples described herein include implementing the small footprint interconnect structure in a three-dimensional stacked integrated circuit device which includes multi-level memory cells and planar conductive material layers. Alternatively, the levels need not be planar stacked material layers, and instead the layers of material can vary in the vertical dimension. The interconnect structure described herein can also be implemented in other types of memory cells and array configurations. For example, in an alternative, the levels of the device may be implemented as planar memory cell arrays separated by insulating material, with the access devices and access lines formed within the levels using thin film transistors or related technologies. In addition, the interconnect structure described herein can be implemented in other types of three-dimensional integrated circuit devices, where having conductors extending to various levels in the device within a small footprint is useful.

Other aspects and advantages of the present invention can be seen on review of the drawings, the detailed description, and the claims which follow.

BRIEF DESCRIPTION OF THE DRAWINGS

FIGS. 3A-3B illustrate respective orthogonal views of a portion of a three-dimensional stacked integrated circuit device including a 3D interconnect structure with a small footprint.

FIGS. 8A-8C to 15 illustrate steps in a fabrication sequence for manufacturing an interconnect structure as described herein.

DETAILED DESCRIPTION

A detailed description of embodiments of the present invention is provided with reference to the FIGS. 1-16.

Figure 1:
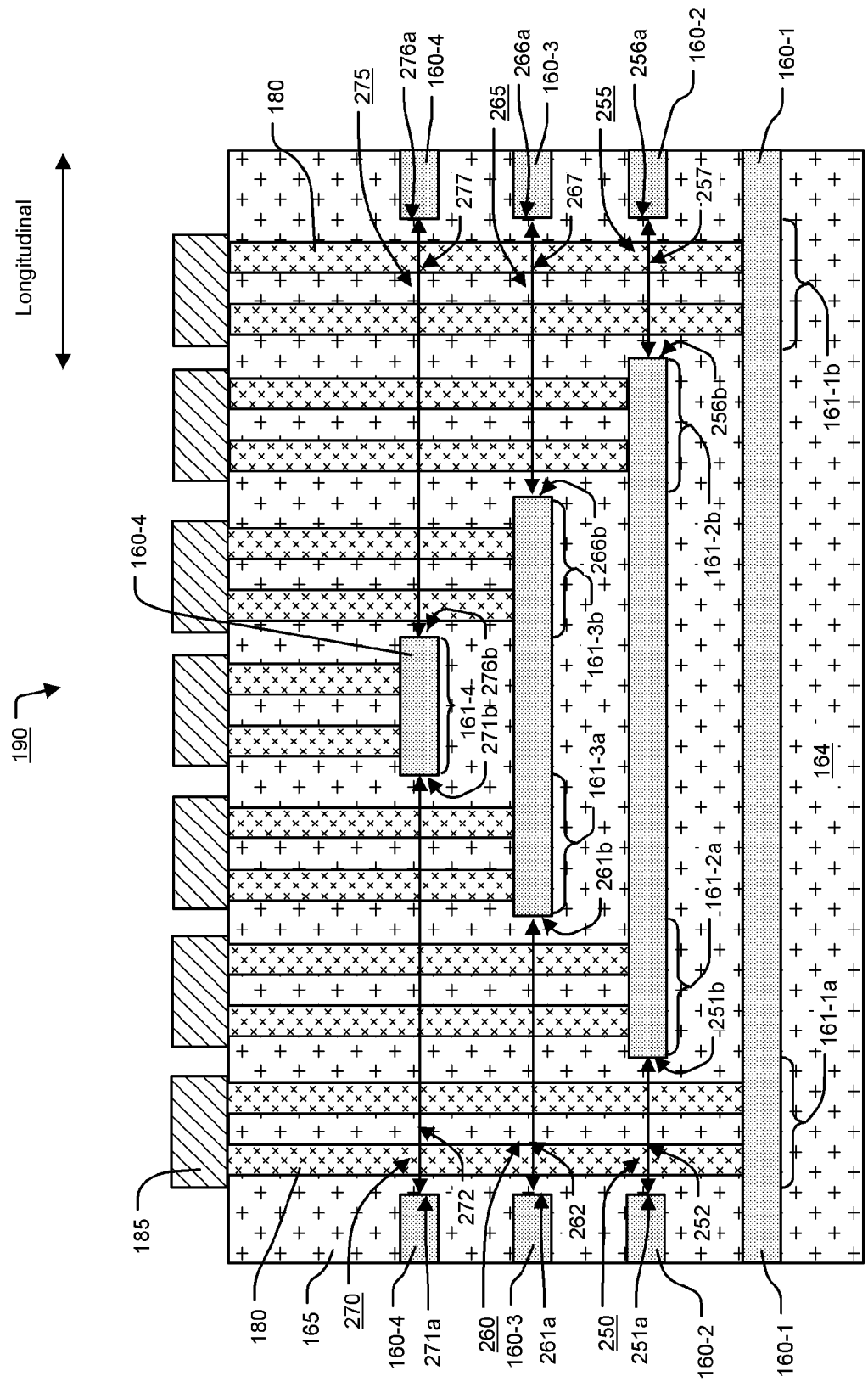
FIG. 1 illustrates a cross-sectional view of a device including a three-dimensional structure having an interconnect structure 190 with a small footprint where conductors 180 extend to various levels 160-1 to 160-4 in the device.

FIG. 1 illustrates a cross-sectional view of a device including three-dimensional structure having an interconnect structure 190 with a small footprint where conductors 180 extend to various levels 160-1 to 160-4 in the device. In the illustrated example four levels 160-1 to 160-4 are shown. More generally, the small interconnect structure 190 described herein can be implemented in a structure having levels 0 to N, where N is at least 2.

The conductors 180 are arranged within the interconnect structure 190 to contact landing areas on the various levels 160-1 to 160-4. As described in more detail below, the conductors 180 for each particular level extend through openings in the overlying levels to contact the landing areas 161-1a, 161-1b, 161-2a, 161-2b, 161-3a, 161-3b, 161-4. The conductors 180 are used in this example for coupling the levels 160-1 to 160-4 to interconnect lines 185 in a wiring layer overlying the levels 160-1 to 160-4.

The landing areas are the portions of levels 160-1 to 160-4 used for contact with conductors 180. The sizes of the landing areas are large enough to provide room for the conductors 180 to adequately couple the levels 160-1 to 160-4 to the overlying interconnect lines 185, as well as to address issues such as misalignment between the conductors 180 and the overlying openings in one level for landing areas in different levels.

The size of a landing area thus depends on a number of factors, including the size and number and number of conductors used, and will vary from embodiment to embodiment. In addition, the number of the conductors 180 can be different for each of the landing areas.

In the illustrated example, the levels 160-1 to 160-4 consist of respective planar conductive layers of material such as doped polysilicon, with layers of insulating material 165 separating the levels 160-1 to 160-4. Alternatively, the levels 160-1 to 160-4 need not be planar stacked material layers, and instead the layers of material can vary in the vertical dimension.

The conductors 180 contacting the different levels 160-1 to 160-4 are arranged in a direction extending along the cross-section illustrated in FIG. 1A. This direction defined by the arrangement of the conductors 180 contacting different levels 160-1 to 160-4 is referred to herein as the "longitudinal" direction. The "transverse" direction is perpendicular to the longitudinal direction, and is into and out of the cross-section illustrated in FIG. 1A. Both the longitudinal and transverse directions are considered to be "lateral dimensions", meaning a direction that is in a two-dimensional area of a plan view of the levels 160-1 to 160-4. The "length" of structures or features is its length in the longitudinal direction, and its "width" is its width in the transverse direction.

Level 160-1 is the lowest level in the plurality of levels 160-1 to 160-4. The level 160-1 is on insulating layer 164.

The level 160-1 includes first and second landing areas 161-1a, 161-1b for contact with conductors 180.

In FIG. 1 the level 160-1 includes two landing areas 161-1a, 161-1b on opposite ends of the interconnect structure 190. In some alternative embodiments one of the landing areas 161-1a, 161-1b is omitted.

Figure 2A:
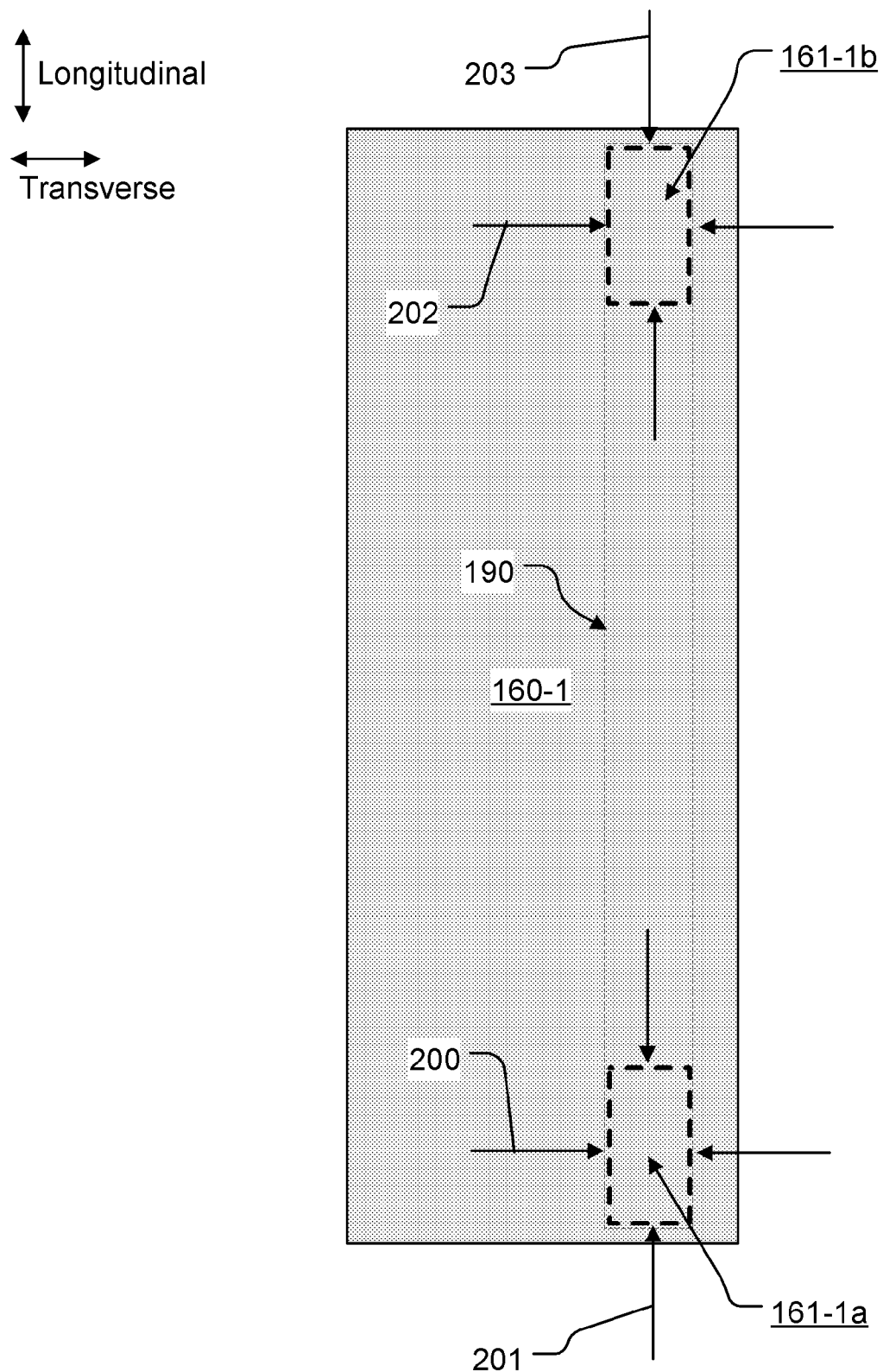
FIG. 2A illustrates a plan view of level 160-1 showing the landing areas.

FIG. 2A is a plan view of a portion of level 160-1, including the landing areas 161-1a, 161-1b within the footprint of the interconnect structure 190. The footprint of the interconnect structure 190 can be close to the width of the via size for the conductors, and have a length that can be much longer than the width. As shown in FIG. 2A, landing area 161-1a has a width 200 in the transverse direction and a length 201 in the longitudinal direction. Landing area 161-1b has a width 202 in the transverse direction and a length 203 in the longitudinal direction. In the embodiment of FIG. 2A the landing areas 161-1a, 161-1b each have a rectangular cross-section. In embodiments, the landing areas 161-1a, 161-1b may each have a cross-section that is circular, elliptical, square, rectangular, or somewhat irregularly shaped.

Because level 160-1 is the lowest level, the conductors 180 need not pass through the level 160-1 to underlying levels. Thus, in this example level 160-1 does not have openings within the interconnect structure 190.

Referring back to FIG. 1, level 160-2 overlies level 160-1. Level 160-2 includes an opening 250 overlying the landing area 161-1a on level 160-1. The opening 250 has a distal longitudinal sidewall 251a and a proximal longitudinal sidewall 251b defining the length 252 of the opening 250. The length 252 of the opening 250 is at least as large as the length 201 of the underlying landing area 161-1a, so that the conductors 180 for the landing area 161-1a can pass through the level 160-2.

The level 160-2 also includes opening 255 overlying the landing area 161-1b. The opening 255 has distal and proximal longitudinal sidewalls 256a, 256b defining the length 257 of the opening 255. The length 257 of the opening 255 is at least as large as the length 203 of the underlying landing area 161-1b, so that the conductors 180 for the landing area 161-1b can pass through the level 160-2.

The level 160-2 also includes first and second landing areas 161-2a, 161-2b adjacent the openings 250, 255 respectively. The first and second landing areas 161-2a, 161-2b are the portions of level 160-2 used for contact with the conductors 180.

Figure 2B:
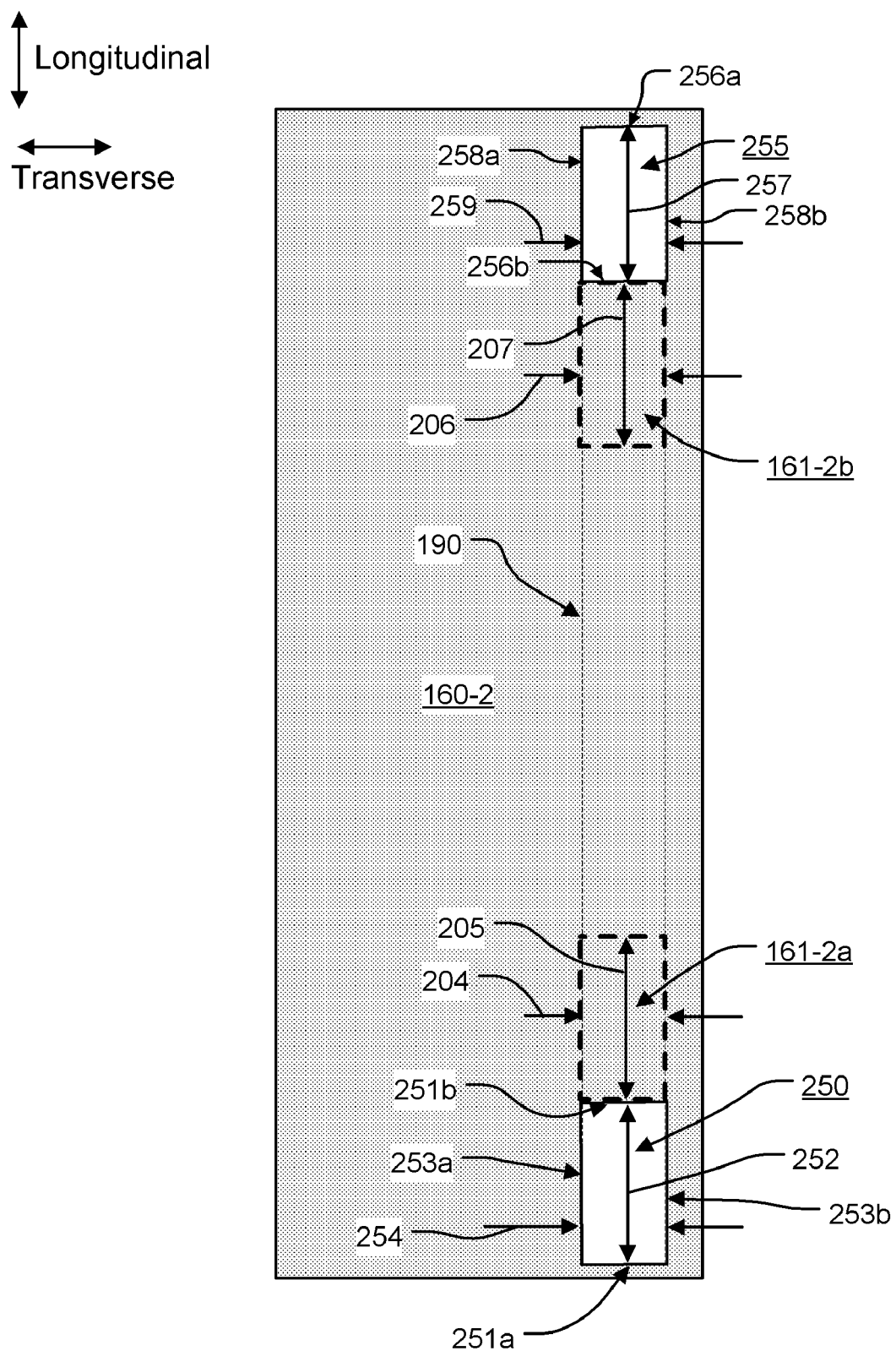
FIG. 2B illustrates a plan view of level 160-2 showing openings adjacent the landing areas.

FIG. 2B is a plan view of a portion of level 160-2, including the first and second landing areas 161-2a, 161-2b and the openings 250, 255 within the interconnect structure 190.

As shown in FIG. 2B, opening 250 has longitudinal sidewalls 251a, 251b defining the length 252, and has transverse sidewalls 253a, 253b defining the width 254 of the opening 250. The width 254 is at least as large as the width 200 of the underlying landing area 161-1a, so that the conductors 180 can pass through the opening 250.

Opening 255 has longitudinal sidewalls 256a, 256b defining the length 257, and has transverse sidewalls 258a, 258b defining the width 259. The width 259 is at least as large as the width 202 of the underlying landing area 161-1b, so that the conductors 180 can pass through the opening 255.

In the plan view of FIG. 2B the openings 250, 255 each have a rectangular cross-section. In embodiments, the openings 250, 255 may each have a cross-section that is circular, elliptical, square, rectangular, or somewhat irregularly shaped, depending on the shape of the mask used to form them.

As shown in FIG. 2B, landing area 161-2a is adjacent the opening 250 and has a width 204 in the transverse direction and a length 205 in the longitudinal direction. Landing area 161-2b is adjacent the opening 255 and has a width 206 in the transverse direction and a length 207 in the longitudinal direction.

Referring back to FIG. 1, level 160-3 overlies level 160-2. Level 160-3 includes an opening 260 overlying landing area 161-1a on level 160-1 and landing area 161-2a on level 160-2. The opening 260 has distal and proximal longitudinal sidewalls 261a, 261b defining the length 262 of the opening 260. The length 262 of the opening 260 is at least as large as the sum of the lengths 201 and 205 of the underlying landing areas 161-1a and 161-2a, so that the conductors 180 for the landing areas 161-1a and 161-2a can pass through the level 160-3.

As can be seen in FIG. 1, the distal longitudinal sidewall 261a of opening 260 is vertically aligned with the distal longitudinal sidewall 251a of the underlying opening 250. In the manufacturing embodiment described in more detail below, the openings can be formed using the opening in a single etch mask and one additional mask formed over the opening in the single etch mask, as well as processes for etching the addition mask without a critical alignment step, resulting in the formation of openings having distal longitudinal sidewalls (261a, 251a, . . . ) along the perimeter of the single etch mask that are vertically aligned.

The level 160-3 also includes opening 265 overlying the landing area 161-1b on level 160-1 and landing area 161-2b on level 160-2. The opening 265 has outside and inside longitudinal sidewalls 266a, 266b defining the length 267 of the opening 265. The outside longitudinal sidewall 266a of opening 265 is vertically aligned with the outside longitudinal sidewall 256a of the underlying opening 255.

The length 267 of the opening 265 is at least as large as sum of the lengths 203 and 207 of the underlying landing areas 161-1b and 161-2b, so that the conductors 180 for the landing areas 161-1b and 161-2b can pass through the level 160-3.

The level 160-3 also includes first and second landing areas 161-3a, 161-3b adjacent the openings 260, 265 respectively. The first and second landing areas 161-3a, 161-3b are the portions of level 160-3 used for contact with the conductors 180.

Figure 2C:
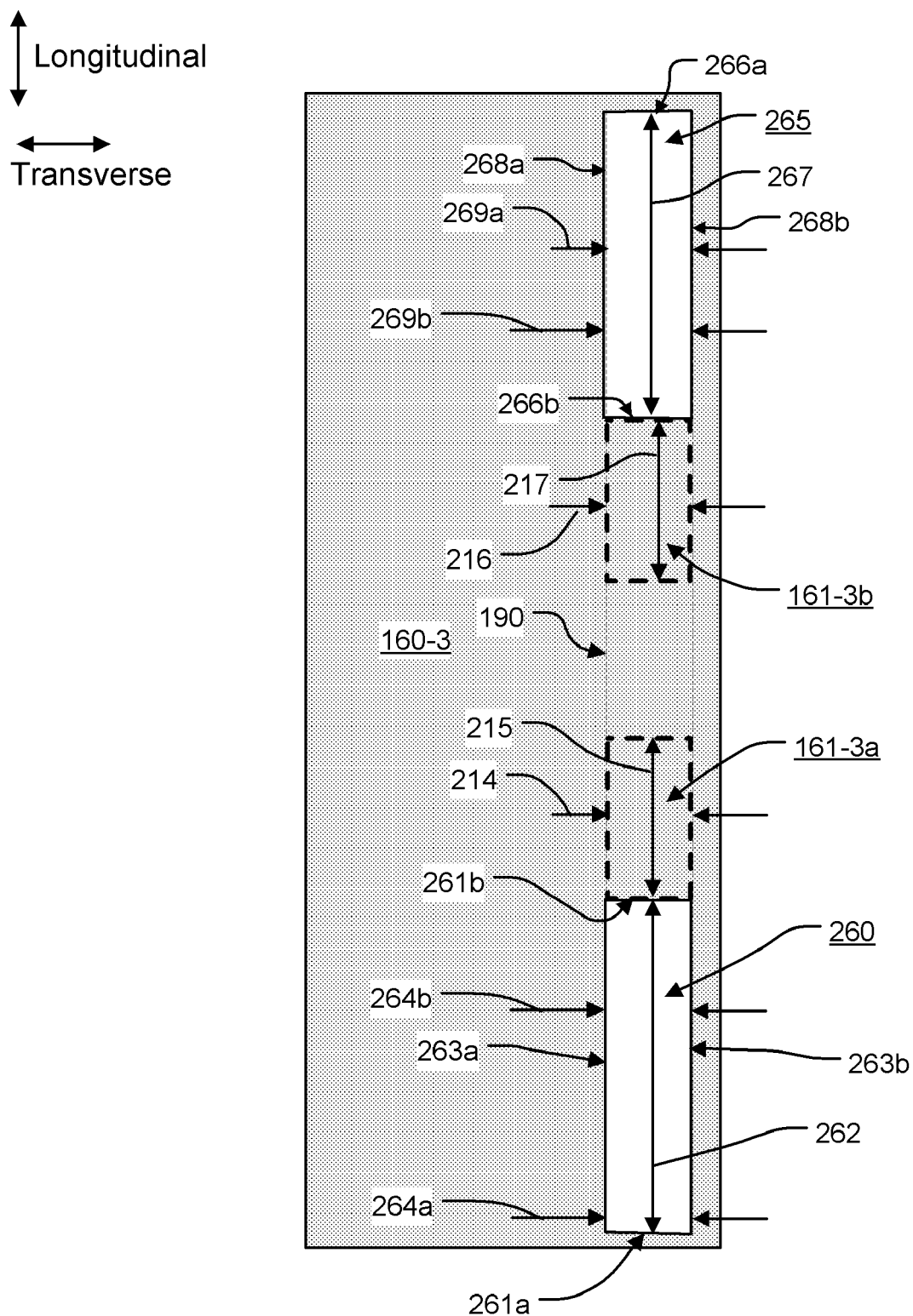
FIG. 2C illustrates a plan view of level 160-3 showing openings adjacent the landing areas.

FIG. 2C is a plan view of a portion of level 160-3, including the first and second landing areas 161-3a, 161-3b and the openings 260, 265 within the interconnect structure 190.

As shown in FIG. 2C, opening 260 has outside and inside longitudinal sidewalls 261a, 261b defining the length 262, and has transverse sidewalls 263a, 263b defining the width 264a, 264b of the opening 260. The width 264a is at least as large as the width 200 of the underlying landing area 161-1a, and width 264b is at least as large as the width 204 of the underlying landing area 161-2a, so that the conductors 180 can pass through the opening 260.

In the illustrated embodiments, widths 264a and 264b are substantially the same. Alternatively, the widths 264a and 264b can be different, in order to accommodate landing areas having different widths.

Opening 265 has longitudinal sidewalls 266a, 266b defining the length 267, and has transverse sidewalls 268a, 268b defining the width 269a, 269b. The width 269a is at least as large as the width 202 of the underlying landing area 161-1b, and the width 269b is at least as large as the width 206 of the underling landing area 161-2b, so that the conductors 180 can pass through the opening 265.

As shown in FIG. 2C, landing area 161-3a is adjacent the opening 260 and has a width 214 in the transverse direction and a length 215 in the longitudinal direction. Landing area 161-3b is adjacent the opening 265 has a width 216 in the transverse direction and a length 217 in the longitudinal direction.

Referring back to FIG. 1, level 160-4 overlies level 160-3. Level 160-4 includes an opening 270 overlying the landing area 161-1a on level 160-1, the landing area 161-2a on level 160-2, and the landing area 161-3a on level 160-3. The opening 270 has longitudinal sidewalls 271a, 271b defining the length 272 of the opening 270. The length 272 of the opening 270 is at least as large as the sum of the lengths 201, 205, and 215 of the underlying landing areas 161-1a, 161-2a, 161-3a so that the conductors 180 for the landing areas 161-1a, 161-2a, 161-3a can pass through the level 160-4. As shown in FIG. 1, the longitudinal sidewall 271a of opening 270 is vertically aligned with the longitudinal sidewall 261a of the underlying opening 260.

The level 160-4 also includes opening 275 overlying the landing area 161-1b on level 160-1, the landing area 161-2b on level 160-2, and the landing area 161-3b on level 160-3. The opening 275 has longitudinal sidewalls 276a, 276b defining the length 277 of the opening 275. The longitudinal sidewall 276a of opening 275 is vertically aligned with the longitudinal sidewall 266a of the underlying opening 265.

The length 277 of the opening 275 is at least as large as sum of the lengths 203, 207, and 217 of the underlying landing areas 161-1b, 161-2b and 161-3b, so that the conductors 180 for the landing areas 161-1b, 161-2b, and 161-3b can pass through the level 160-4.

The level 160-4 also includes a landing area 161-4 between the openings 270, 275. The landing area 161-4 is the portion of level 160-4 used for contact with the conductors 180. In FIG. 1, the level 160-4 has one landing area 161-4. Alternatively, the level 160-4 may include more than one landing area.

Figure 2D:
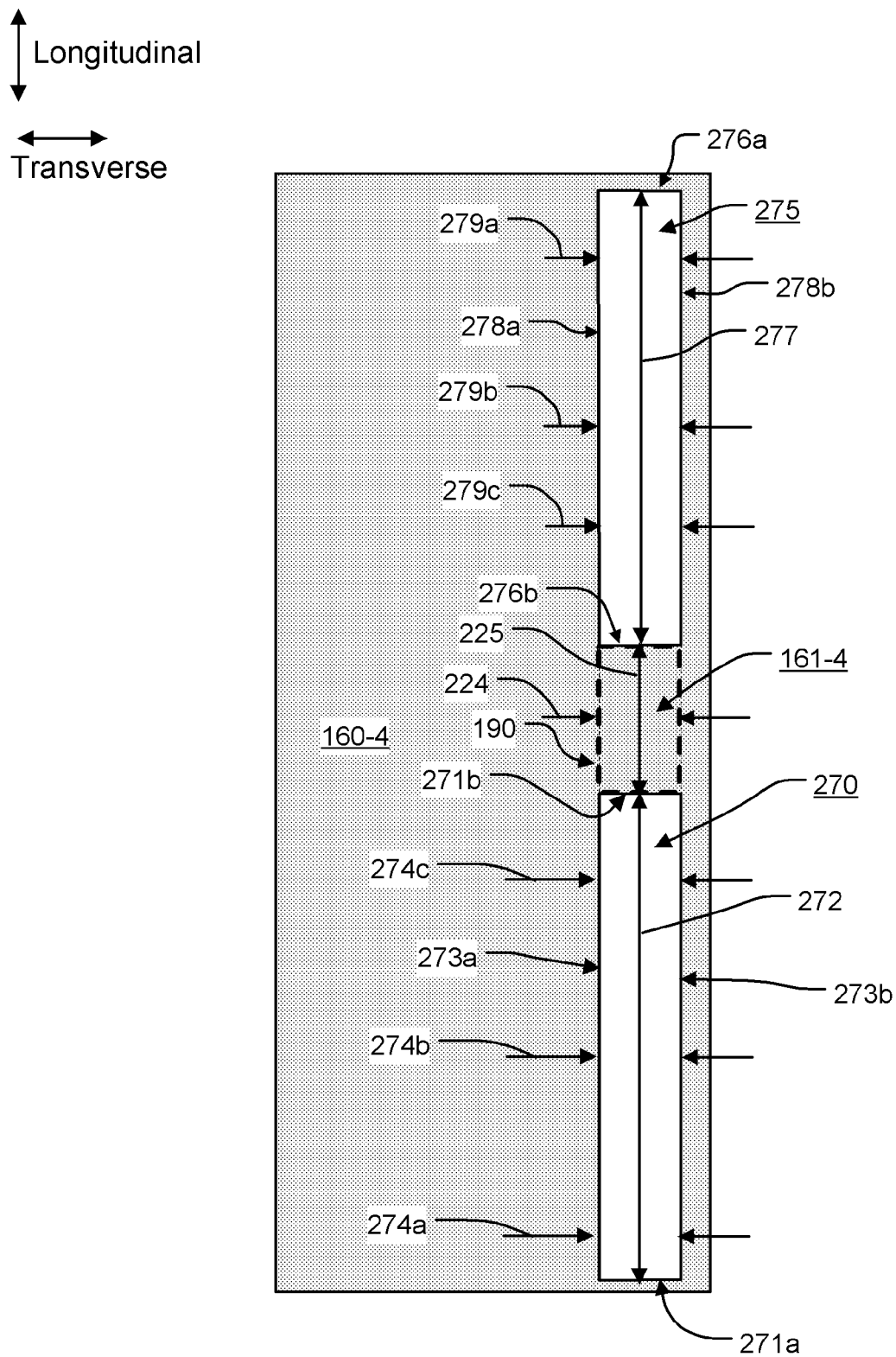
FIG. 2D illustrates a plan view of level 160-4 showing openings adjacent the landing area.

FIG. 2D is a plan view of a portion of level 160-4, including landing area 161-4 and the openings 270, 275 within the interconnect structure 190.

As shown in FIG. 2D, opening 270 has longitudinal sidewalls 271a, 271b defining the length 272, and has transverse sidewalls 273a, 273b defining the width 274a, 274b, 274c of the opening 270. The widths 274a, 274b, 274c are at least as large as the widths 200, 204, and 214 of the underlying landing areas 161-1a, 161-2a and 161-3a, so that the conductors 180 can pass through the opening 260.

Opening 275 has longitudinal sidewalls 276a, 276b defining the length 277, and has transverse sidewalls 278a, 278b defining the width 279a, 279b, 279c. The widths 279a, 279b, 279c are at least as large as the widths 202, 206, and 216 of the underlying landing areas 161-1b, 161-2b and 161-3b, so that the conductors 180 can pass through the opening 275.

As shown in FIG. 2D, landing area 161-4 is between the openings 270, 275 and has a width 224 in the transverse direction and a length 225 in the longitudinal direction.

Referring back to FIG. 1, the distal longitudinal sidewalls 271a, 261a, and 251a of openings 270, 260, and 250 are vertically aligned, so that the difference in the length of the openings 270, 260, and 250 is due to the horizontal offset of the sidewalls 271b, 261b, and 251b. As used herein, elements or features "vertically aligned" are substantially flush with an imaginary plane perpendicular to both the transverse and longitudinal directions. As used herein, the term "substantially flush" is intended to accommodate manufacturing tolerances in the formation of the openings using the opening in a single etch mask and multiple etch processes which may cause variations in the planarity of the sidewalls.

As shown in FIG. 1, the longitudinal sidewalls 276a, 266a, and 256a of openings 275, 265, and 255 also are vertically aligned.

Similarly, the transverse sidewalls of the openings in the levels are also vertically aligned. Referring to FIGS. 2A-2D, the transverse sidewalls 273a, 263a, and 253a of openings 270, 260, and 250 are vertically aligned. In addition the transverse sidewalls 273b, 263b, and 253b are vertically aligned. For openings 275, 265, and 255 the longitudinal sidewalls 276*a*, 266*a*, and 256*a* are vertically aligned, and the transverse sidewalls 276*b*, 266*b*, and 256*b* are vertically aligned.

In the illustrated embodiment, the openings in the various levels 160-1 to 160-4 have substantially the same width in the transverse direction. Alternatively, the width of the openings can vary along the longitudinal direction, for example in a step-like manner, in order to accommodate landing areas having different widths.

This technique for implementing the interconnect structure 190 as described herein significantly reduces the area or footprint needed for making contact to the plurality of levels 160-1 to 160-4, compared to prior art techniques. As a result, more space is available for implementing memory circuits in the various levels 160-1 to 160-4. This allows for higher memory density and a smaller cost per bit in the upper levels compared to prior art techniques.

In the cross-section of FIG. 1, the openings within the interconnect structure 190 result in the levels having a staircase-like pattern on both sides of the landing area 161-4 on level 160-4. That is, the two openings in each level are symmetrical about an axis perpendicular to both the longitudinal and transverse directions, and the two landing areas of each level are also symmetrical about that axis. As used herein, the term "symmetrical" is intended to accommodate manufacturing tolerances in the formation of the openings using the opening in a single etch mask and multiple etch processes which may cause variations in the dimensions of the openings.

In alternative embodiments in which each level includes a single opening and a single landing area, the levels have a staircase-like pattern on only one side.

In the illustrated example four levels 160-1 through 160-4 are shown. More generally, the small interconnect structure described herein can be implemented in levels 0 to N, where N is at least 2. Generally, level (i), for (i) equal to 1 through N, overlies level (i−1), and has an opening (i) adjacent the landing area (i) on level (i). The opening (i) extends over the landing area (i−1) on level (i−1), and for (i) greater than 1, over the adjacent opening (i−1) in level (i−1). The opening (i) has a distal longitudinal sidewall aligned with the distal longitudinal sidewall of opening (i−1) in level (i), and a proximal longitudinal sidewall defining a length of the opening (i). The length of the opening (i) is at least as large as the length of the landing area (i−1) plus the length of the opening (i−1), if any. For (i) greater than 1, the opening (i) has transverse sidewalls aligned with the transverse sidewalls of opening (i−1) in level (i−1) and defines a width of the opening (i) at least as large as the width of the landing area (i−1).

Other types of memory cells and configurations can be used in alternative embodiments. Examples of the other types of memory cells which may be used include dielectric charge trapping and floating gate memory cells. For example, in an alternative the levels of the device may be implemented as planar memory cell arrays separated by insulating material, with the access devices and access lines formed within the levels using thin film transistors or related technologies. In addition, the interconnect structure described herein can be implemented in other types of three-dimensional stacked integrated circuit devices, where having conductors extending to various levels in the device within a small footprint is useful.

FIG. 3A is a cross-section of a portion of a three-dimensional stacked integrated circuit device 100 including a memory array region 110 and a periphery region 120 with an interconnect structure 190 as described herein.

In FIG. 3A, the memory array region 110 is implemented as one-time programmable multi-level memory cells as described in U.S. patent application Ser. No. 12/430,290 by Lung, which is commonly owned by the assignee of the present application and incorporated by reference herein. It is described here as a representative integrated circuit structure in which the 3D interconnect structure described herein can be implemented.

The memory array region 110 includes a memory access layer 112 including horizontal field effect transistor access devices 131*a*, 131*b* having source regions 132*a*, 132*b* and drain regions 134*a*, 134*b* in a semiconductor substrate 130. The substrate 130 can comprise bulk silicon or a layer of silicon on an insulating layer or other structures known in the art for supporting integrated circuits. Trench isolation structures 135*a*, 135*b* isolate regions in the substrate 130. Word lines 140*a*, 140*b* act as gates for the access devices 131*a*, 131*b*. Contact plugs 142*a*, 142*b* extend through inter-layer dielectric 144 to couple the drain regions 134*a*, 134*b* to bit lines 150*a*, 150*b*.

Contact pads 152*a*, 152*b* are coupled to underlying contacts 146*a*, 146*b*, providing connection to the source regions 132*a*, 132*b* of the access transistors. The contact pads 152*a*, 152*b* and bit lines 150*a*, 150*b* are within an inter-layer dielectric 154.

In the illustrated example the levels consist of respective planar conductive layers of material such as doped polysilicon. Alternatively, the levels need not be planar stacked material layers, and instead the layers of material can vary in the vertical dimension.

Insulating layers 165-1 to 165-3 separate the levels 160-1 to 160-4 from one another. An insulating layer 166 overlies the levels 160-1 to 160-4 and insulating layers 165-1 to 165-3.

A plurality of electrode pillars 171*a*, 171*b* are arranged on top of the memory cell access layer 112 and extend through the levels. In this drawing, a first electrode pillar 171*a* includes a central conductive core 170*a* made for example of tungsten or other suitable electrode material, surrounded by a polysilicon sheath 172*a*. A layer 174*a* of anti-fuse material, or other programmable memory material, is formed between the polysilicon sheath 172*a* and the plurality of levels 160-1 through 160-4. The levels 160-1 through 160-4 comprise a relatively highly doped, n-type polysilicon in this example, while the polysilicon sheath 172*a* comprises a relatively lightly doped, p-type polysilicon. Preferably, the thickness of the polysilicon sheath 172*a* is greater than the depth of the depletion region formed by the p-n junction. The depth of the depletion region is determined in part by the relative doping concentrations of the n-type and p-type polysilicon used to form it. The levels 160-1 through 160-4 and the sheath 172*a* can be implemented using amorphous silicon as well. Also, other semiconductor materials could be utilized.

The first electrode pillar 171*a* is coupled to the pad 152*a*. A second electrode pillar 171*b* including conductive core 170*b*, polysilicon sheath 172*b*, and anti-fuse material layer 174*b* is coupled to the pad 152*b*.

Interface regions between the plurality of levels 160-1 through 160-4 and the pillars 171*a*, 171*b* include memory elements comprising a programmable element in series with a rectifier, as explained in more detail below.

In the native state, the layer 174*a* of anti-fuse material of pillar 171*a*, which can be a silicon dioxide, silicon oxynitride, or other silicon oxide, has a high resistance. Other anti-fuse materials may be used, such as silicon nitride. After programming by applying appropriate voltages to the word lines 140, bit lines 150, and the plurality of levels 160-1 to 160-4, the layer 174*a* of anti-fuse material breaks down and an active area within the anti-fuse material adjacent a corresponding level assumes a low resistance state.

As shown in FIG. 3A, the plurality of conductive layers of levels 160-1 to 160-4 extend into the periphery region 120 where supporting circuitry and conductors 180 are made to the plurality levels 160-1 to 160-4. A wide variety of devices are implemented in the periphery 120 to support decoding logic and other circuits on the integrated circuit 100.

The conductors 180 are arranged within the interconnect structure 190 to contact landing areas on the various levels 160-1 to 160-4. As discussed in more detail below, the conductors 180 for each particular level 160-1 to 160-4 extend through openings in the overlying levels to a wiring layer including conductive interconnect lines 185. The conductive interconnect lines 185 provide for interconnection between the levels 160-1 to 160-4 and decoding circuitry in the periphery 120.

As represented by the dashed line in FIG. 3A, the conductors 180 contacting the different levels 160-1 to 160-4 are arranged in the longitudinal direction extending into and out of the cross-section illustrated in FIG. 3A.

Figure 3B:
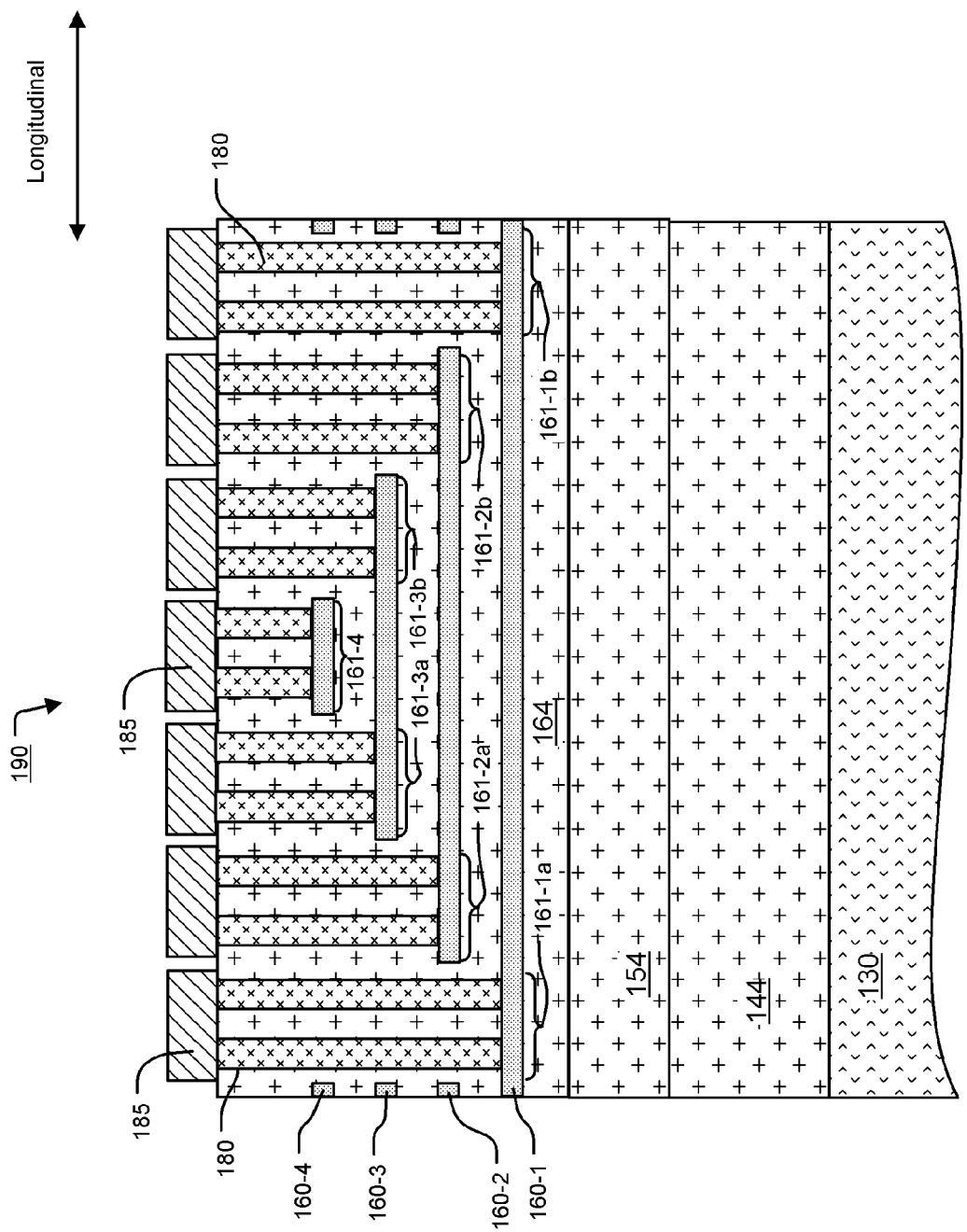

FIG. 3B is a cross-sectional view in the longitudinal direction taken along line FIG. 3B-FIG. 3B through the interconnect structure 190 of FIG. 3A, showing a view of the interconnect structure 190 like that shown in FIG. 1. As can be seen in FIG. 3B, the conductors 180 for each particular level extend through openings in the overlying levels to contact the landing areas.

In the illustrated example four levels 160-1 through 160-4 are shown. More generally, the small interconnect structure described herein can be implemented in levels 0 to N, where N is at least 2.

Other types of memory cells and configurations can be used in alternative embodiments. For example, in an alternative the levels of the device may be implemented as planar memory cell arrays separated by insulating material, with the access devices and access lines formed within the levels using thin film transistors or related technologies. In addition, the interconnect structure described herein can be implemented in other types of three-dimensional stacked integrated circuit devices, where having conductors extending to various levels in the device within a small footprint is useful.

Figure 4:
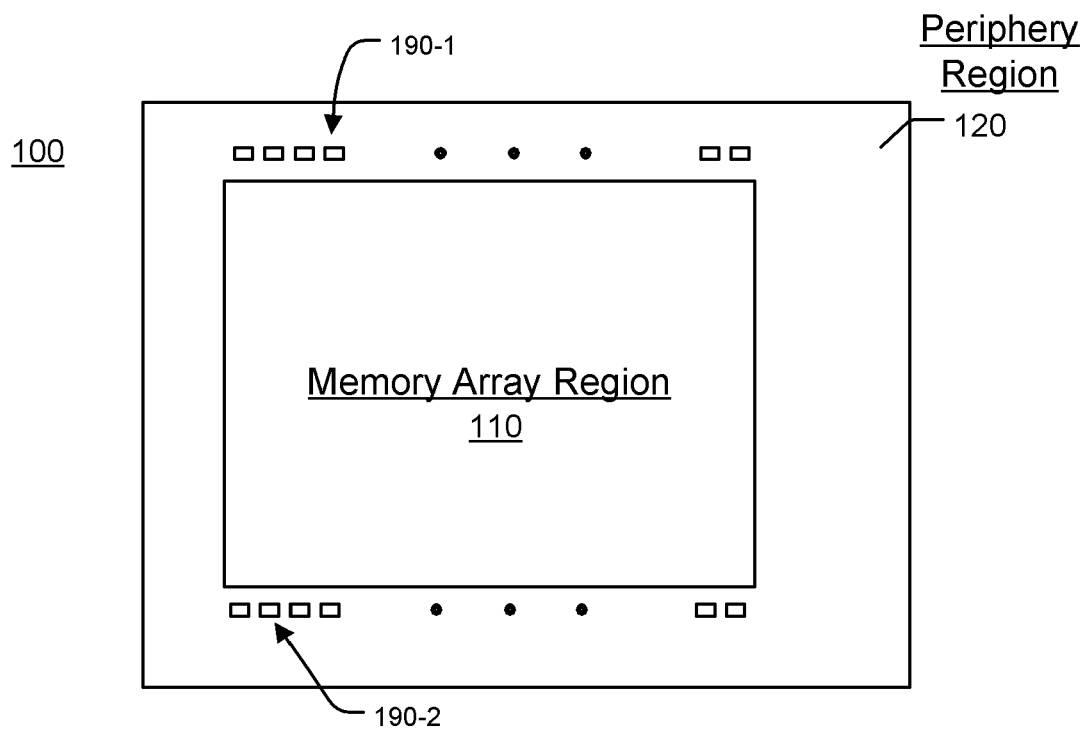
FIG. 4 illustrates a top view layout of an embodiment of the device which includes interconnect structures in the periphery on two sides of a memory array.
Figure 5:
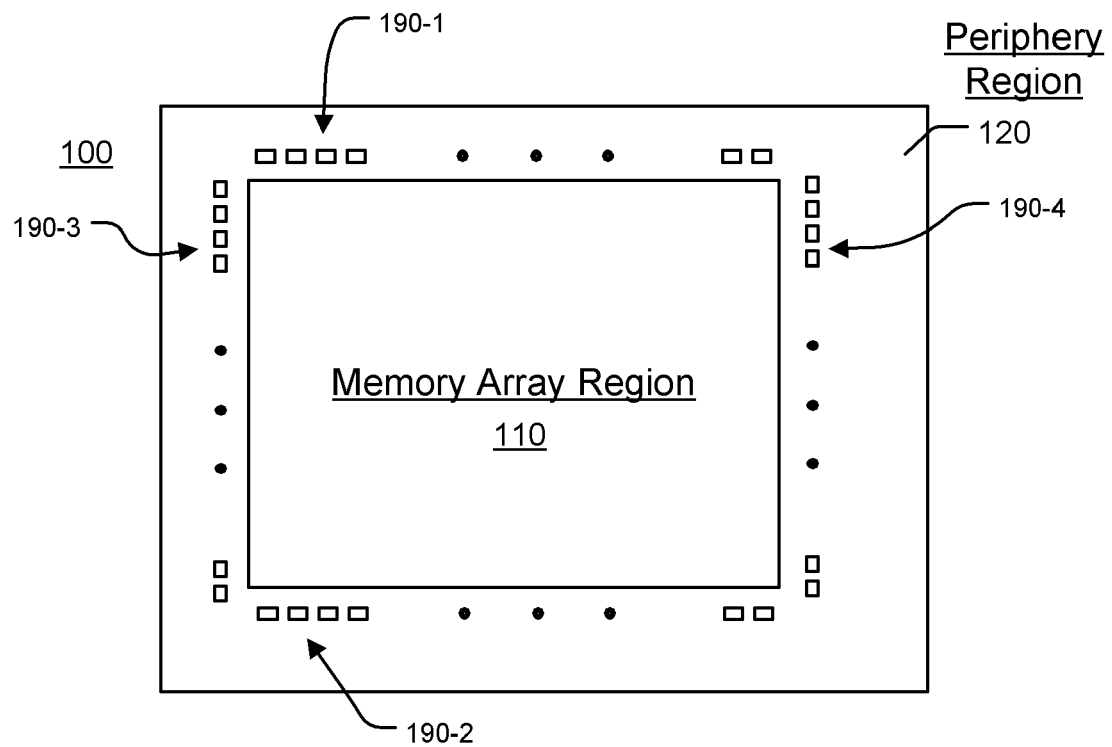
FIG. 5 illustrates a top view layout of an embodiment of the device which includes interconnect structures in the periphery on four sides of a memory array.

In FIGS. 3A-3B, a single interconnect structure 190 is shown. A plurality of interconnect structures can be arranged at various locations in the device, such as surrounding the memory array region 110, so as to provide more even power distribution. FIG. 4 illustrates a top view layout of an embodiment of the device 100 which includes a two series of interconnect structures, including series in the regions 190-1 and 190-2 in the periphery 120 on respective sides of an array. FIG. 5 illustrates a top view layout of an embodiment which includes four series of interconnect structures, including series 190-1, 190-2, 190-3, and 190-4, in the periphery 120 on all four sides of an array. For an example array size including 1000 columns and 1000 rows of cells, and having 10 levels, with a feature size F defining the word line width and the bit line width, and in which the size of the landing areas on the levels is alls about F, then one can see that the length of the area occupied by one interconnect structure is about 2 F times the number of levels or 20 F, while the pitch per word line is about 2 F or more making the width of the array about 2000 F. Thus, following this example, about 100 interconnect structures could be formed in a series such as series 190-3 along the array width, and a similar number could be formed in a series such as series 190-1 along the array length.

In yet other alternative embodiments, one or more interconnect structures can be implemented within the memory array region 110 in addition to, or as a replacement of, having an interconnect structure in the periphery 120. In addition, the interconnect structures can extend diagonally or in any other direction, rather than being parallel to an edge of the memory array region 110.

Figure 6:
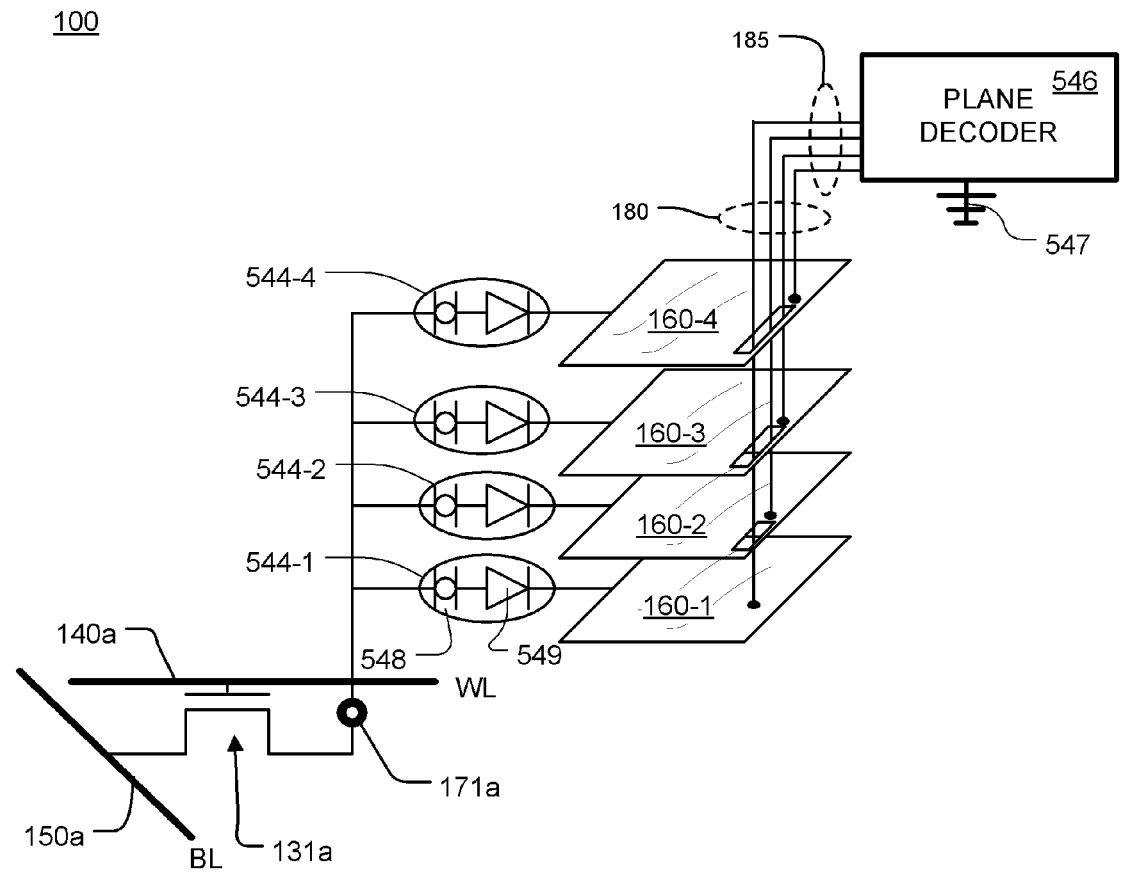
FIG. 6 is a schematic diagram of a portion of the memory device including an interconnect structure as described herein.

FIG. 6 is a schematic illustration of a portion of the memory device including an interconnect structure as described herein. First electrode pillar 171a is coupled to the access transistor 131a which is selected using the bit line 150a and word line 140a. A plurality of memory elements 544-1 through 544-4 are connected to the pillar 171a. Each of the memory elements includes a programmable element 548 in series with a rectifier 549. This series arrangement represents the structure shown in FIGS. 3A-3B, even though the layer of anti-fuse material is placed at the p-n junction. The programmable element 548 is represented by a symbol often used to indicate anti-fuses. However, it will be understood that other types of programmable resistance materials and structures can be utilized.

Also, the rectifier 549 implemented by the p-n junction between the conductive plane and the polysilicon in the electrode pillar can be replaced by other rectifiers. For example, a rectifier based on a solid electrolyte like germanium silicide, or other suitable material, could be used to provide a rectifier. See U.S. Pat. No. 7,382,647 for other representative solid electrolyte materials.

Each of the memory elements 544-1 through 544-4 is coupled to corresponding conductive levels 160-1 through 160-4. The levels 160-1 to 160-4 are coupled via conductors 180 and interconnect lines 185 to a plane decoder 546. The plane decoder 546 is responsive to addresses to apply a voltage, such as ground 547, to a selected level so that the rectifier in the memory element is forward biased and conducting, and to apply a voltage to or float unselected levels so that the rectifier in the memory element is reversed biased or non-conducting.

Figure 7:
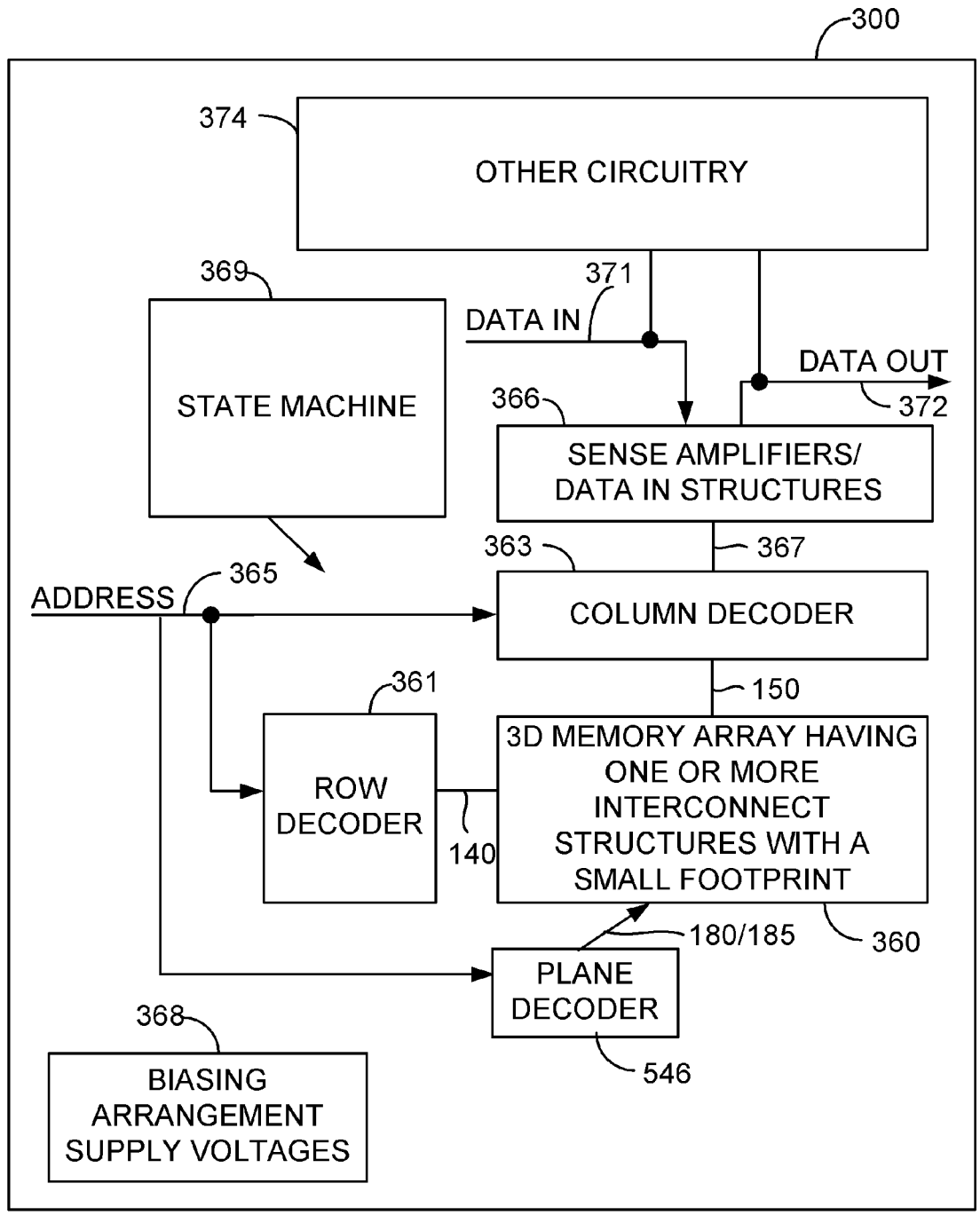
FIG. 7 is a simplified block diagram of an integrated circuit device including a 3D memory array having an interconnect structure as described herein.

FIG. 7 is a simplified block diagram of an integrated circuit device 300 including a 3D memory array 360 having an interconnect structure as described herein. A row decoder 361 is coupled to a plurality of word lines 140 arranged along rows in the memory array 360. A column decoder 363 is coupled to a plurality of bit lines 150 arranged along columns in the memory array 360 for reading and programming data from the memory cells in the array 360. The plane decoder 546 is coupled to a plurality of levels 160-1 to 160-4 in the memory array 360 via conductors 180 and interconnect lines 185. Addresses are supplied on bus 365 to column decoder 363, row decoder 361, and plane decoder 546. Sense amplifiers and data-in structures in block 366 are coupled to the column decoder 363 in this example via data bus 367. Data is supplied via the data-in line 371 from input/output ports on the integrated circuit 300, to the data-in structures in block 366. In the illustrated embodiment, other circuitry 374 is included on the integrated circuit 300, such as a general purpose processor or special purpose application circuitry, or a combination of modules providing system-on-a-chip functionality. Data is supplied via data-out line 372 from the sense amplifiers in block 366 to input/output ports on the integrated circuit 300, or to other data destinations internal or external to the integrated circuit 300.

A controller implemented in this example using bias arrangement state machine 369 controls the application of bias arrangement supply voltages generated or provided through the voltage supply or supplies in block 368, such as read and program voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

FIGS. 8A-8C to 15 illustrate steps in an embodiment of a fabrication sequence for manufacturing an interconnect structure having a very small footprint as described herein.

Figure 8B:
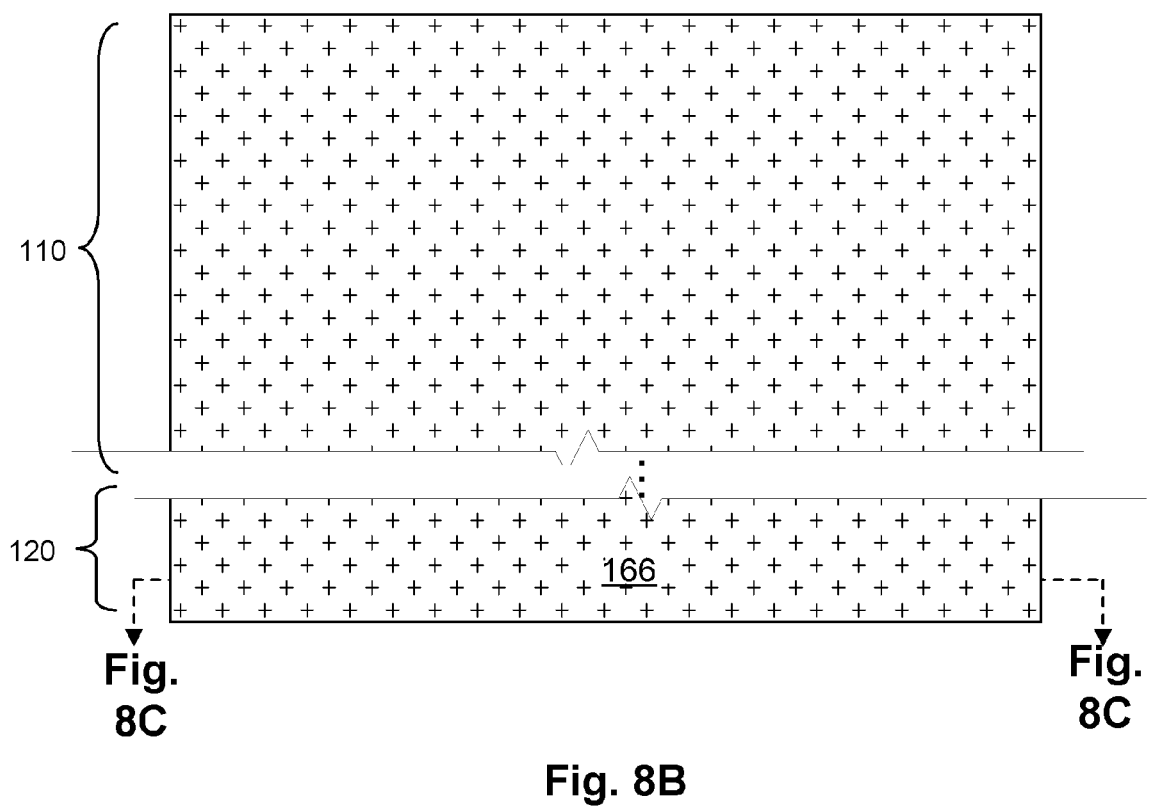
Figure 8C:
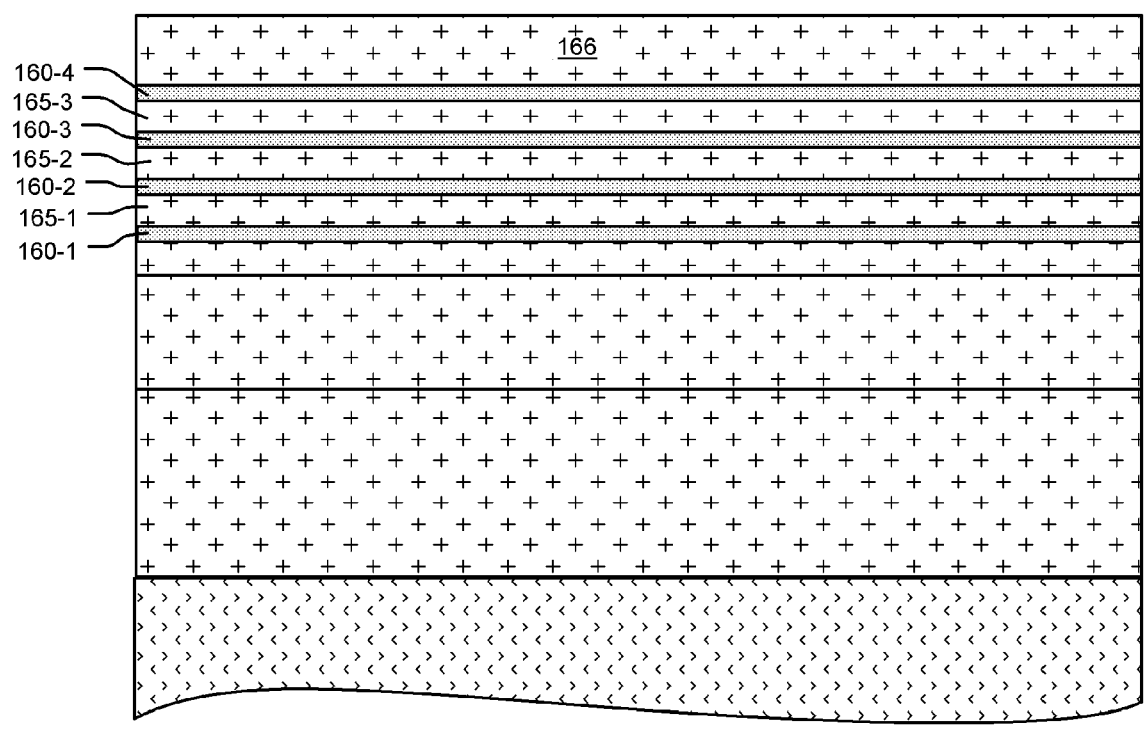

FIGS. 8A and 8C illustrate cross-sectional views, and FIG. 8B illustrates a top view, of a first step of the fabrication sequence. For the purposes of this application, the first step involves forming a plurality of levels 160-1 to 160-4 overlying the provided memory cell access layer 112. In the illustrated embodiment the structure illustrated in FIGS. 8A-8C is formed using processes described in commonly owned U.S. patent application Ser. No. 12/430,290 by Lung, which was incorporated by reference above.

In alternative embodiments, the levels can be formed by standard processes as known in the art and may include access devices such as transistors and diodes, word lines, bit lines and source lines, conductive plugs, and doped regions within a substrate, depending upon the device in which the interconnect structure described herein is to be implemented.

As noted above, other types of memory cells and configurations for the memory array region 110 can also be used in alternative embodiments.

Figure 9B:
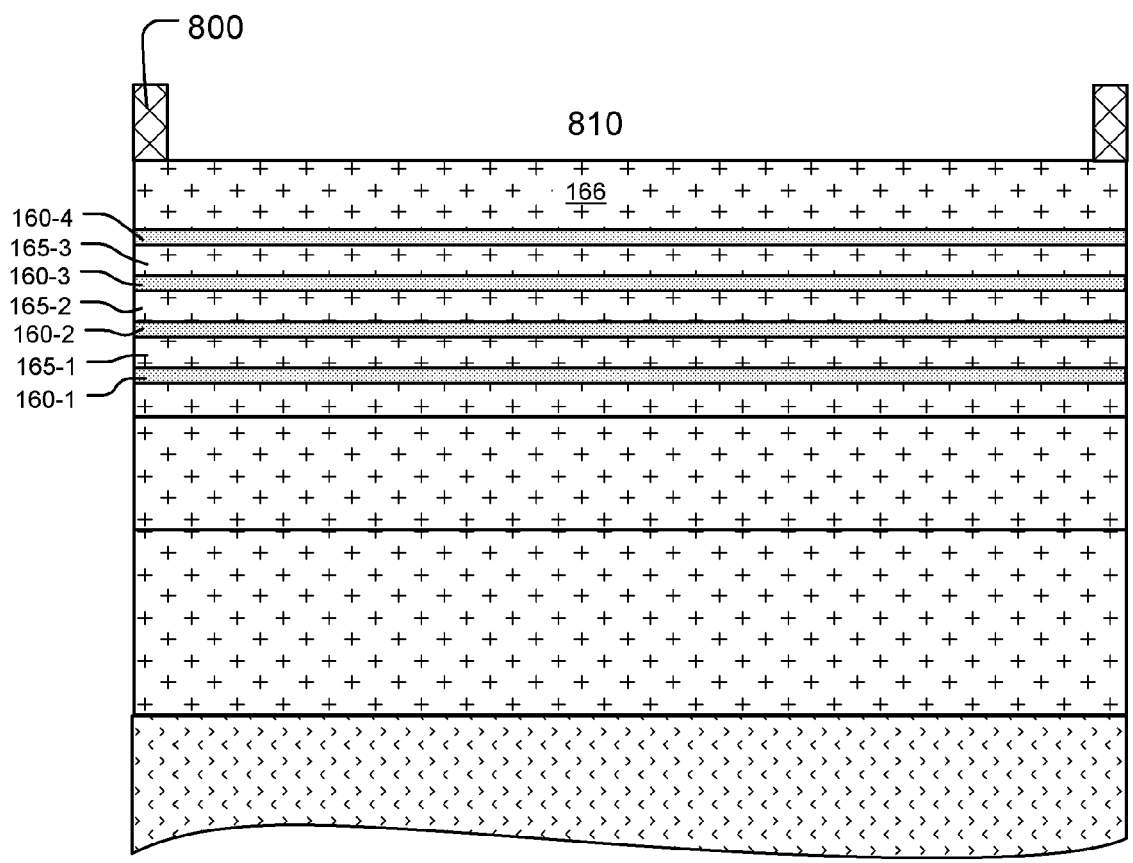

Next, a first mask 800 having an opening 810 is formed on the structure illustrated in FIGS. 8A-8C, resulting in the structure illustrated in the top and cross-sectional views of FIGS. 9A and 9B respectively. The first mask 800 can be formed by depositing the layer for the first mask 800, and patterning the layer using lithographic techniques to form the opening 810. The first mask 800 may comprise for example a hard mask material such as silicon nitride, silicon oxide, or silicon oxynitride.

The opening 810 in the first mask 800 surrounds the perimeter of the combination of landing areas on the levels 160-1 to 160-4. Thus, the width 192 of the opening 810 is at least as large as the widths of the landing areas on the levels 160-1 to 160-4, so that the subsequently formed conductors 180 can pass through the openings in the levels. The length 194 of the opening 810 is at least as large as the sum of the lengths of the landing areas on the levels 160-1 to 160-4, so that the subsequently formed conductors 180 can pass through the openings in the levels.

Figure 10A:
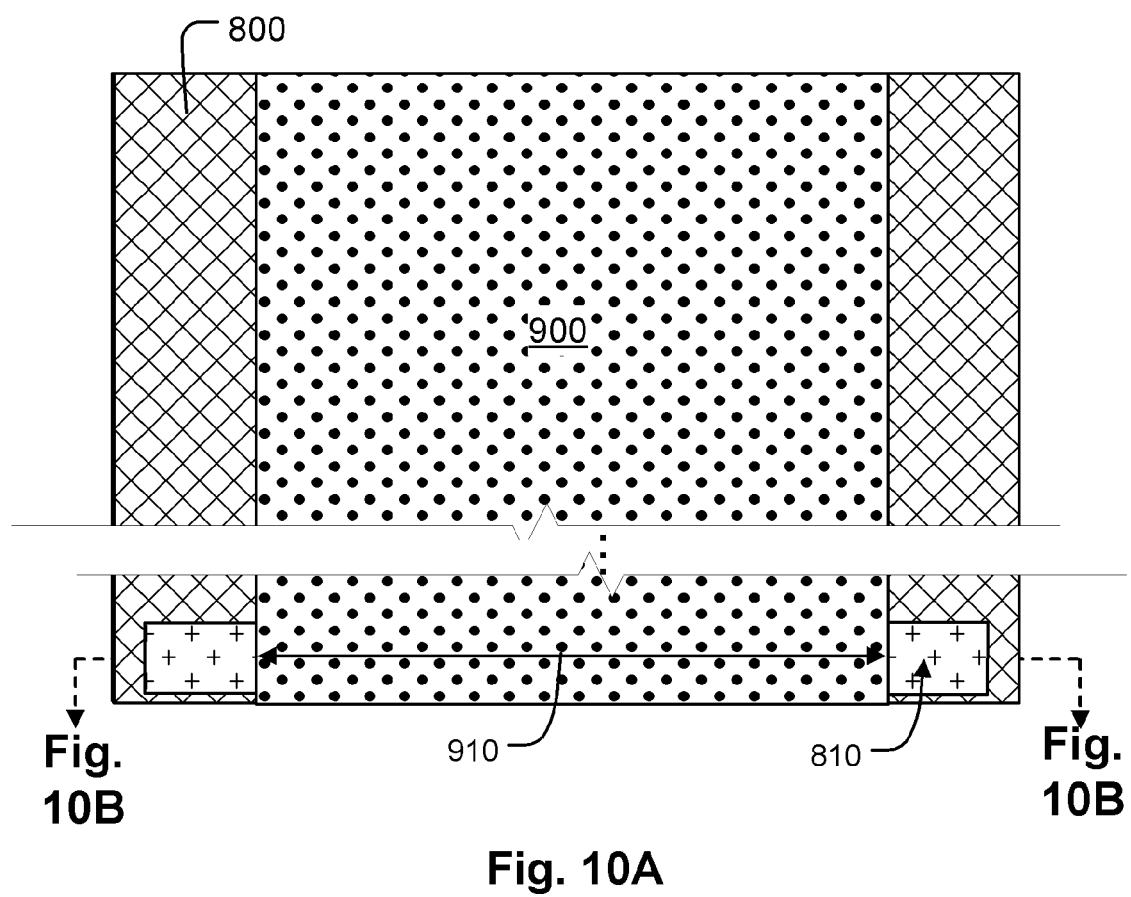
Figure 10B:
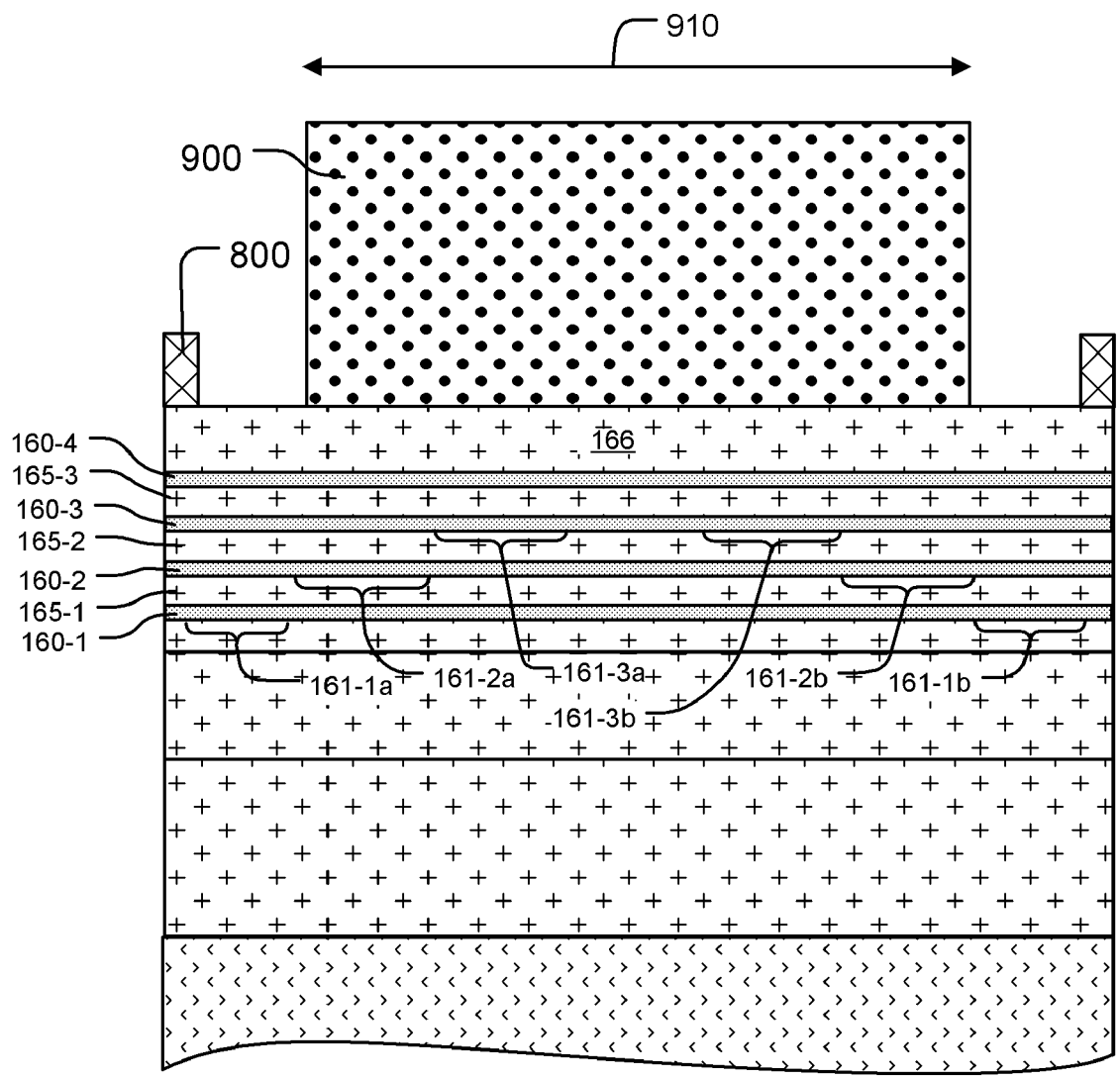

Next, a second etch mask 900 is formed on the structure illustrated in FIGS. 9A-9B, including within the opening 810, resulting in the structure illustrated in the top and cross-sectional views of FIGS. 10A and 10B respectively. As shown in the Figures, the second etch mask 900 has a length 910 less than the length 194 of the opening 810, and has a width at least as large as the width 192 of the opening 810.

In the illustrated embodiment, the second etch mask 900 comprises a material that can be selectively etched relative to the material of the first mask 800, so that the length of the second mask 900 within the opening 810 can be selectively reduced in subsequent process steps described below. In other words, the material of the second mask 900 has an etching rate greater than an etching rate of the material of the first mask 800 for the process used to reduce the length of the second mask 900. For example, in embodiments in which the first mask 800 comprises a hard mask material, the second mask can comprise photoresist.

Figure 11A:
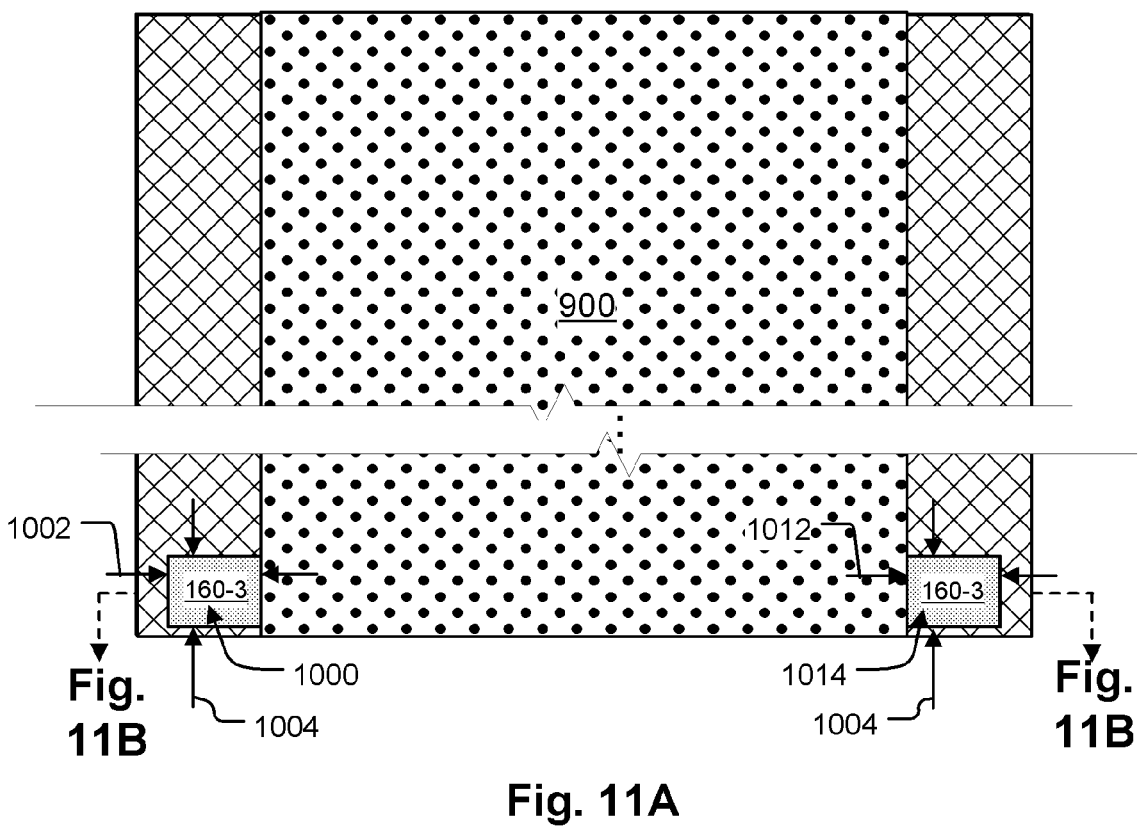
Figure 11B:
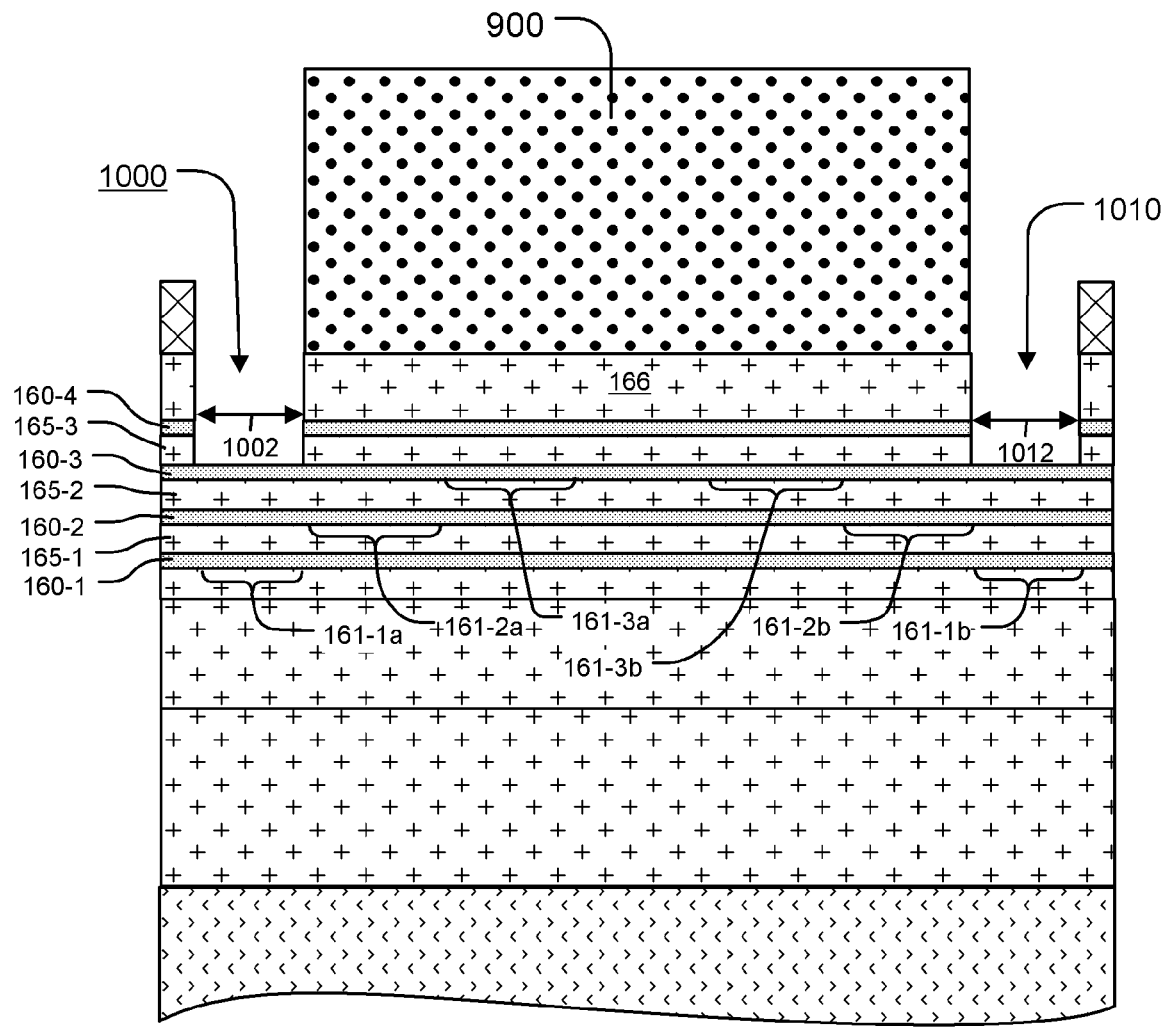

Next, an etching process is performed on the structure illustrated in FIGS. 10A-10B using the first and second masks 800, 900 as etch masks, resulting in the structure illustrated in the top and cross-sectional views of FIGS. 11A and 11B respectively. The etching process can be carried out using a single etch chemistry using, for example, timing mode etching. Alternatively, the etching process can be carried out using different etch chemistries to individually etch through insulating layer 166, level 160-4, insulating material 165-3, and level 160-3.

The etching forms an opening 1000 through the level 160-4 to expose a portion of level 160-3. The opening 1000 overlies the landing area 161-1a on level 160-1. The opening 1000 has a length 1002 at least as large as the length of the landing area 161-1a, and has a width 1004 at least as large as the width of the landing area 161-1a.

The etching also forms opening 1010 through the level 160-4 to expose a portion of level 160-3. The opening 1010 overlies the landing area 161-1b on level 160-1. The opening 1010 has a length 1012 at least as large as the length of the landing area 161-1b, and has a width 1014 at least as large as the width of the landing area 161-1b Next, the length 910 of the mask 900 is reduced to form reduced length mask 1100 with length 1110, resulting in the structure illustrated in the top and cross-sectional views of FIGS. 12A and 12B respectively. In the illustrated embodiment the mask 900 comprises photoresist, and can be trimmed for example using reactive ion etching with $CL_2$ or HBr based chemistries.

Figure 12A:
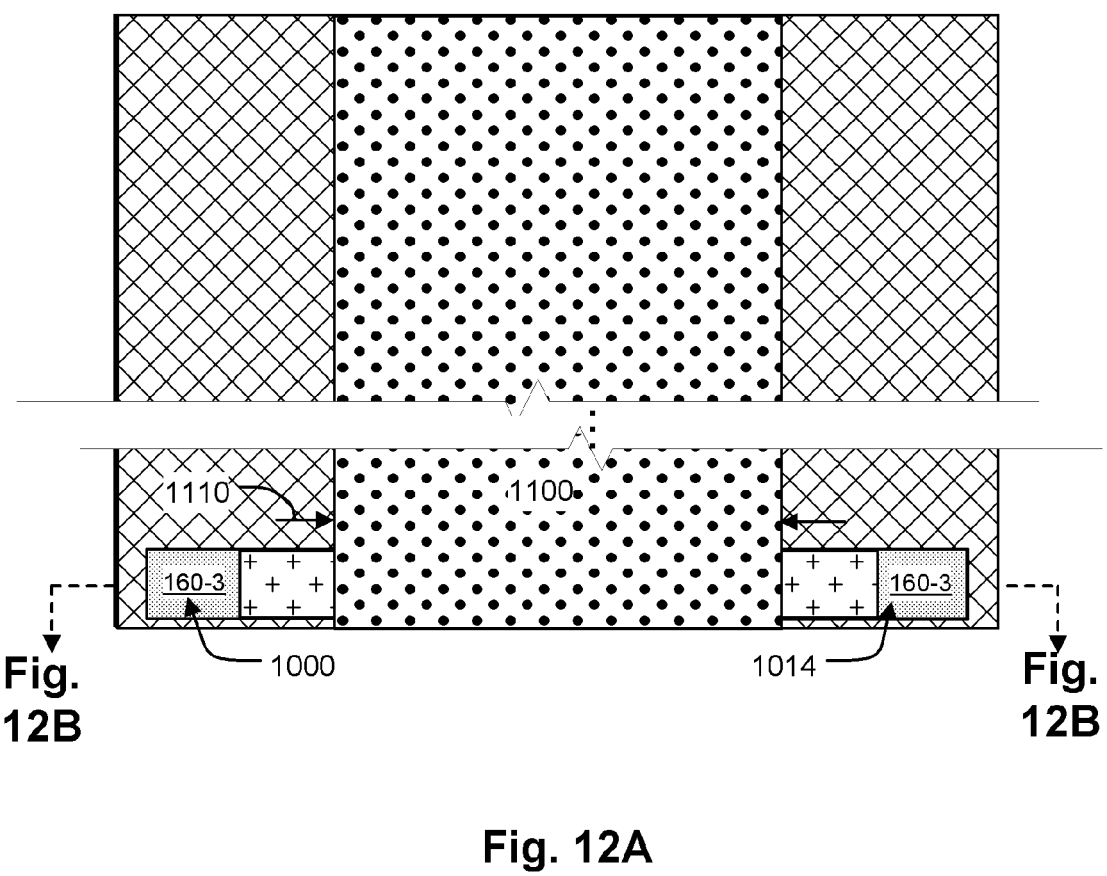
Figure 12B:
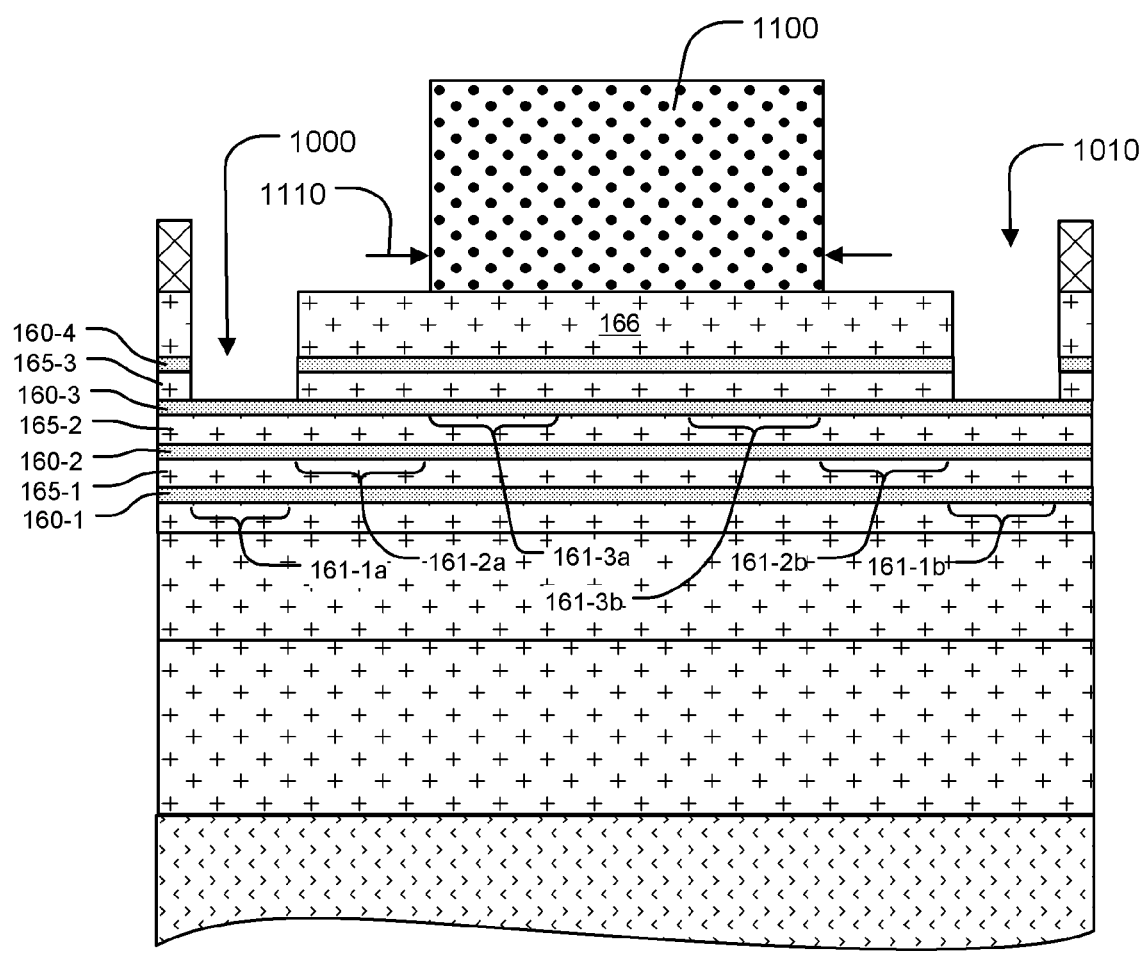
Figure 13A:
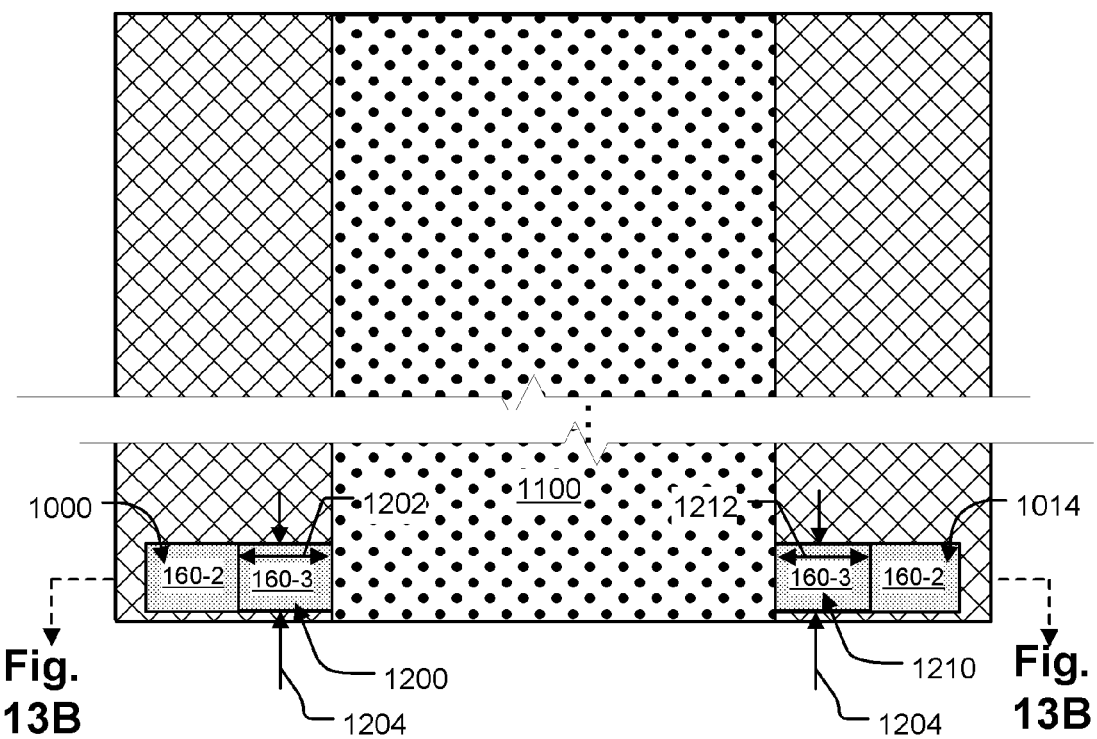
Figure 13B:
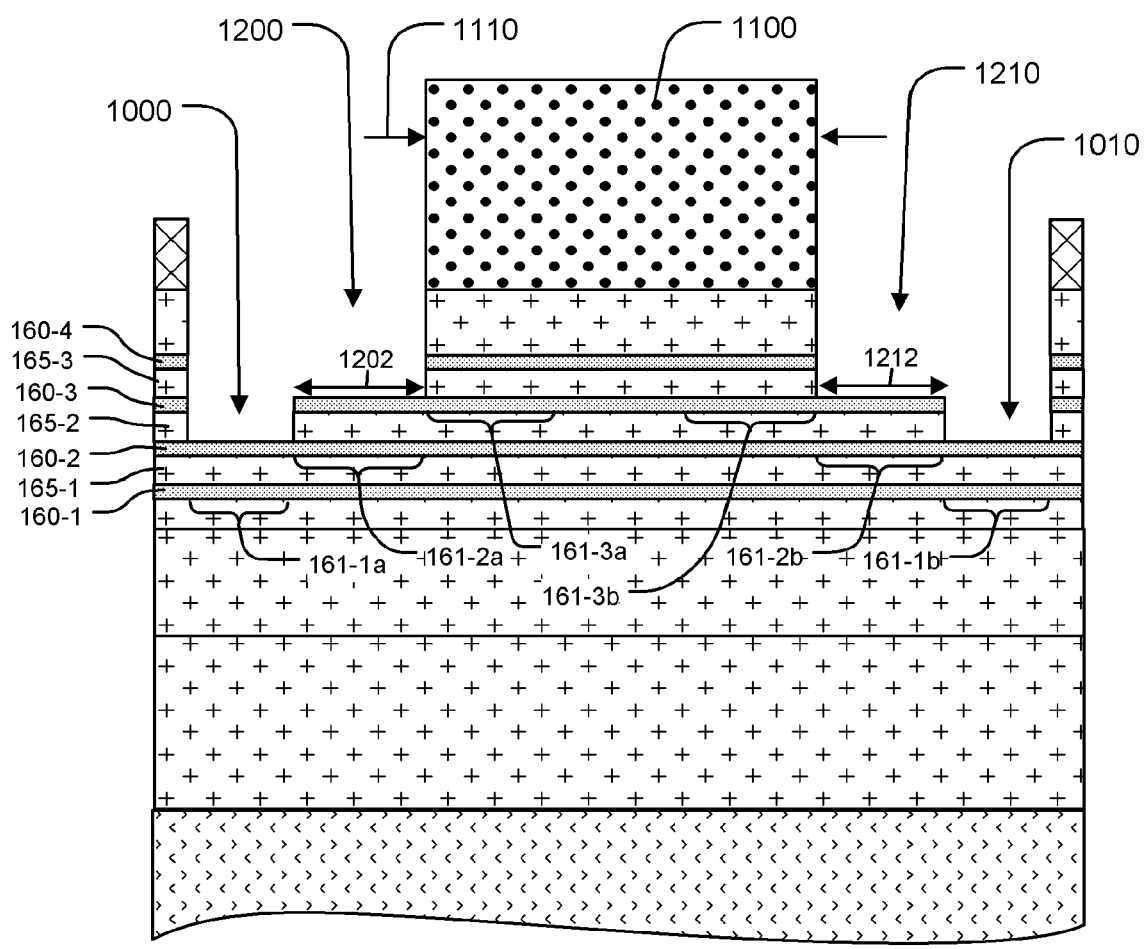

Next, an etching process is performed on the structure illustrated in FIGS. 12A-12B using the first mask 800 and the reduced length mask 1100 as etch masks, resulting in the structure illustrated in the top and cross-sectional views of FIGS. 13A and 13B.

The etching process extends the openings 1000, 1010 through level 160-3 to expose underlying portions of the level 160-2.

The etching also forms openings 1200, 1210 through the portions of the level 160-4 no longer covered by the mask 1100 due to the reduction in the length of mask 1100, thereby exposing portions of level 160-3. The opening 1200 is formed adjacent opening 1000, and overlies the landing area 161-2a on level 160-2. The opening 1200 has a length 1202 at least as large as the length of the landing area 161-2a, and has a width 1204 at least as large as the width of the landing area 161-2a.

The opening 1210 is formed adjacent opening 1010, and overlies the landing area 161-2b on level 160-2. The opening 1210 has a length 1212 at least as large as the length of the landing area 161-2b, and has a width 120 at least as large as the width of the landing area 161-2b.

Next, the length 1110 of the mask 1100 is reduced to form reduced length mask 1300 with length 1305. An etching process performed using the first mask 800 and the mask 1300 as etch masks, resulting in the structure illustrated in the top and cross-sectional views of FIGS. 14A and 14B.

The etching process extends the openings 1000, 1010 through level 160-2 to expose the landing areas 161-1a, 161-1b on level 160-1. The etching process also extends the openings 1200, 1210 through level 160-3 to expose the landing areas 161-2a, 161-2b on level 160-2.

The etching also forms openings 1310, 1320 through the portions of the level 160-4 no longer covered due to the reduction in the length of mask 1300, thereby exposing the landing areas 161-3a, 161-3b on level 160-3.

The opening 1310 is formed adjacent opening 1200. The opening 1310 has a length 1312 at least as large as the length of the landing area 161-3a, and has a width 1314 at least as large as the width of the landing area 161-3a.

The opening 1320 is formed adjacent opening 1210. The opening 1320 has a length 1322 at least as large as the length of the landing area 161-3b, and has a width 1324 at least as large as the width of the landing area 161-3b.

Figure 14A:
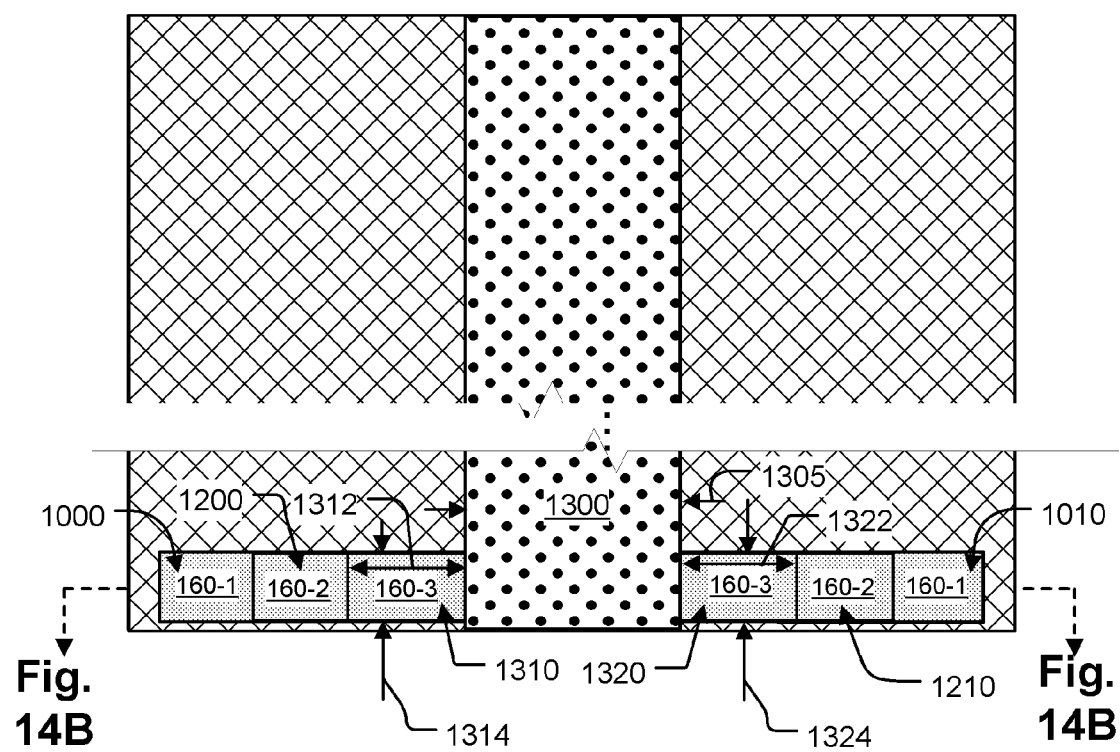
Figure 14B:
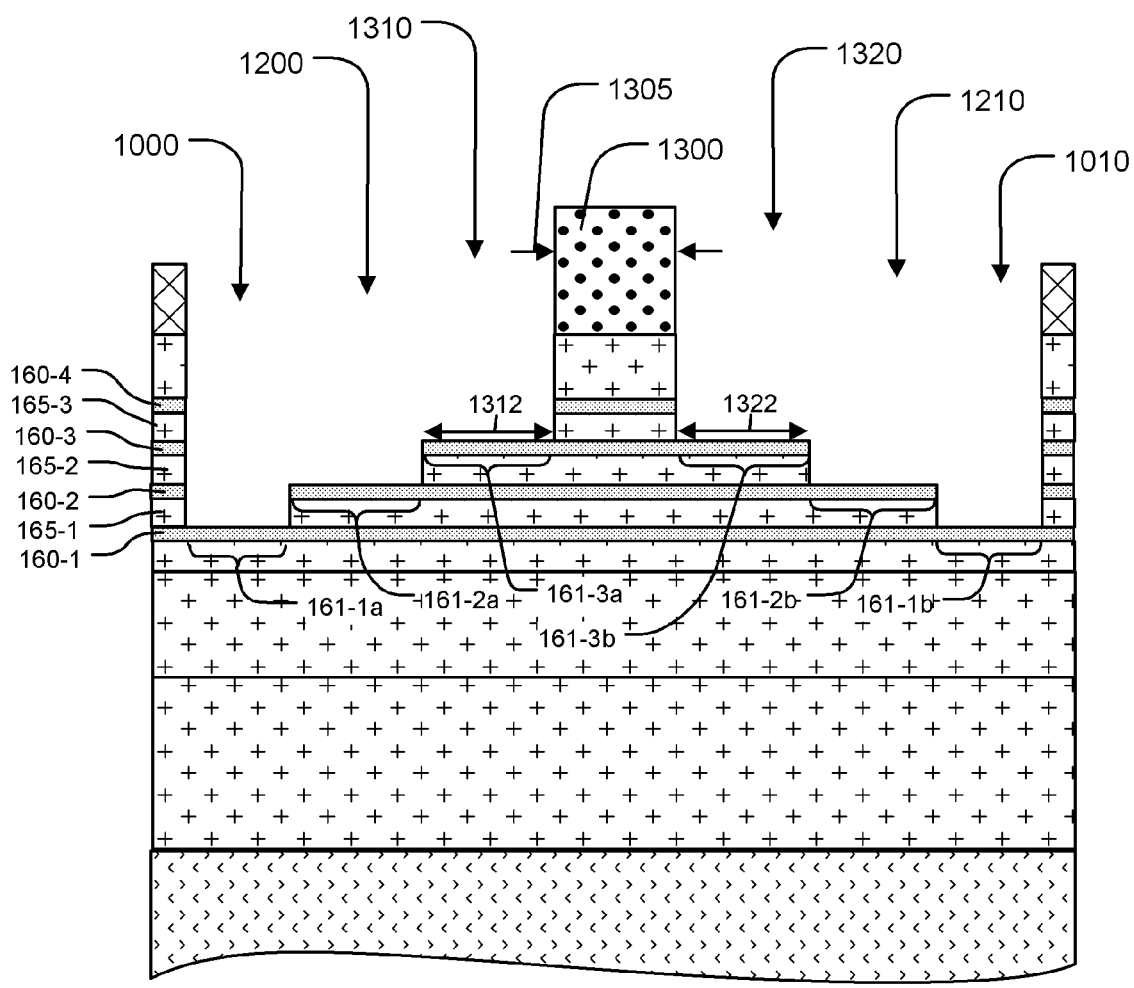
Figure 15:
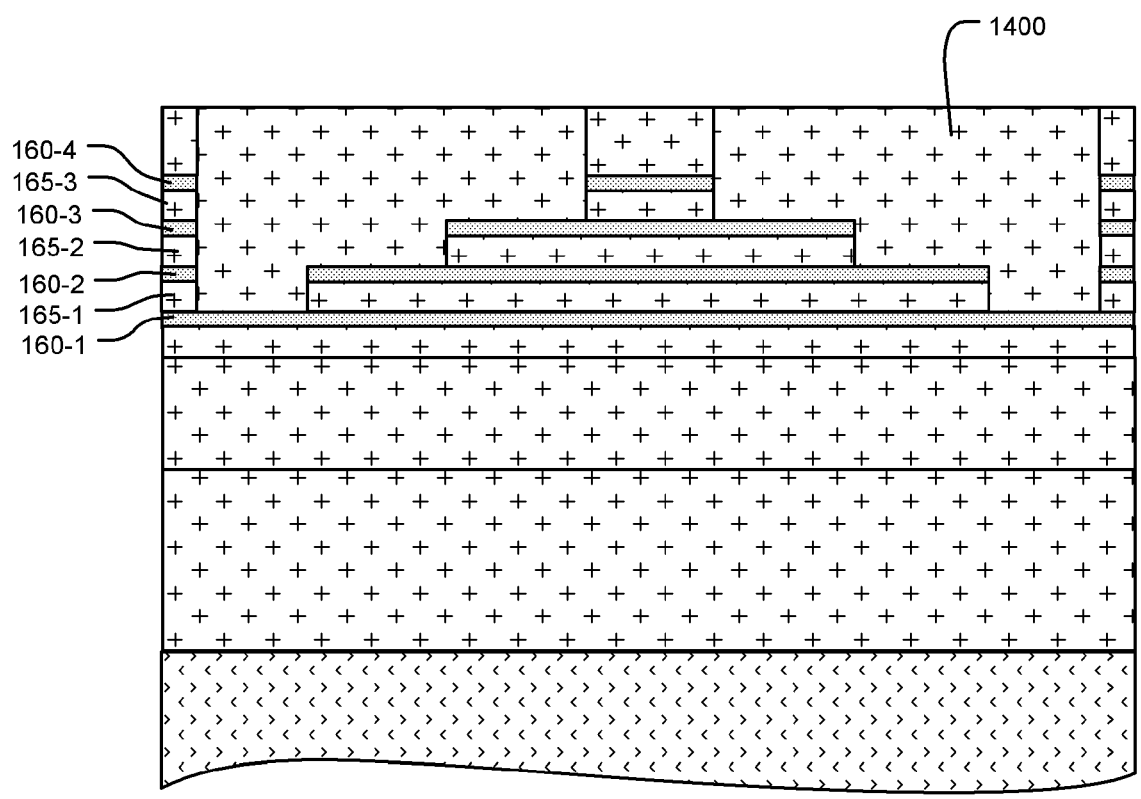

Next, insulating fill material 1400 is deposited on the structure illustrated in FIGS. 14A-14B and a planarization process such as Chemical Mechanical Polishing (CMP) is performed to remove the masks 800, 1300, resulting in the structure illustrated in the cross-sectional view of FIG. 15.

Next, a lithographic pattern is formed to define vias to the landing areas for the conductors 180. Reactive ion etching can be applied to form deep, high aspect ratio vias through the insulating fill material 1400 to provide vias for the conductors 180. After opening the vias, the vias are filled with tungsten or other conductive material to form the conductors 180. Metallization processes are then applied to form interconnect lines 185 to provide interconnection between the conductors 180 and plane decoding circuitry on the device. Finally, back end of line BEOL processes are applied to complete the integrated circuit, resulting in the structure illustrated in FIGS. 3A-3B.

The openings in the various levels used for passing conductors to the landing areas on underlying levels are formed by patterning the levels using the opening 810 in the single etch mask 800, as well as processes for etching the additional mask without a critical alignment step. As a result the openings in the various levels having vertically aligned sidewalls are formed in a self-aligned manner.

In the illustrated examples described above, the opening 810 in the mask 800 has a rectangular cross-section in plan view. As a result, the openings in the various levels have substantially the same width along the transverse direction. Alternatively, the opening in the mask 800 can have a cross-section that is circular, elliptical, square, rectangular, or somewhat irregularly shaped, depending on the shape of the landings areas of the various levels.

Figure 16:
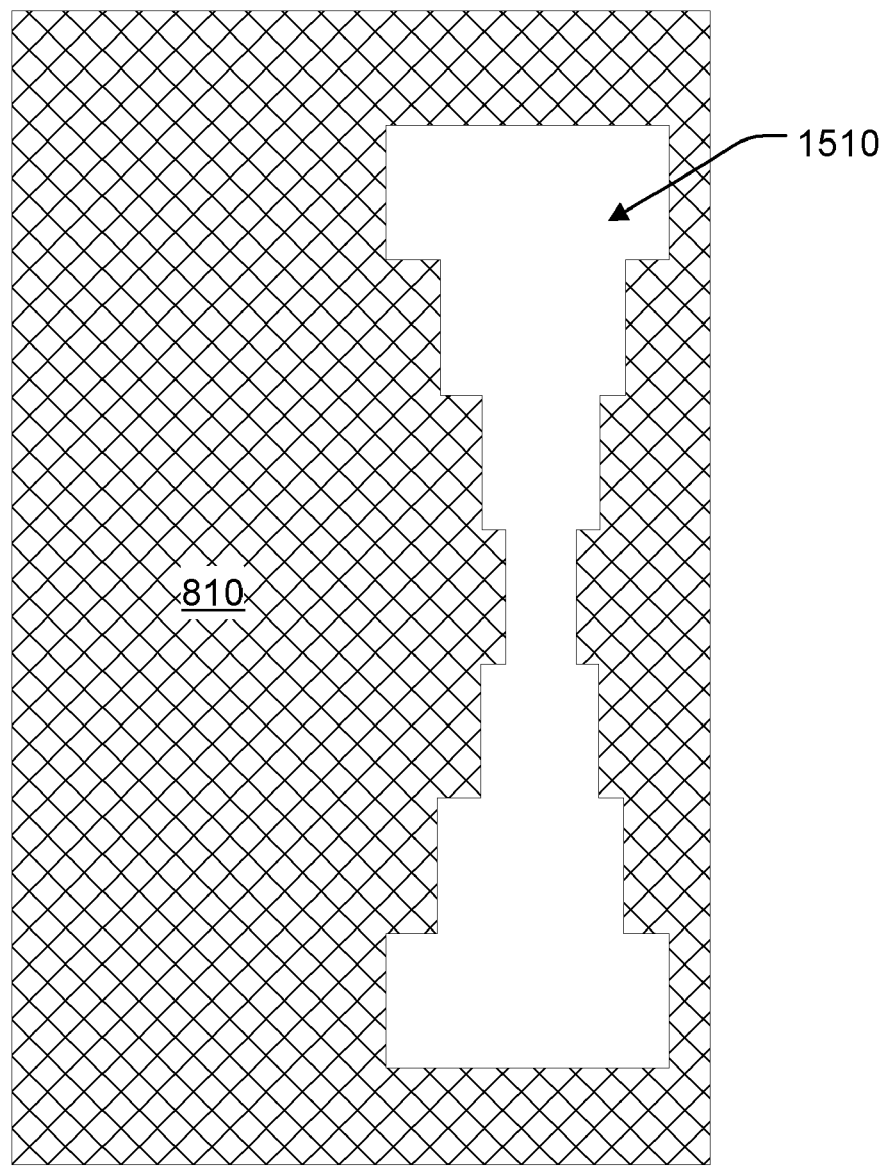
FIG. 16 illustrates a plan view of an opening in a mask having a width varying in the longitudinal direction in a step-like manner, to accommodate varying widths of landing areas on the levels.

For example, the width of the opening in the mask 800 can vary along the longitudinal direction, in order to accommodate landing areas having different widths. FIG. 16 illustrates a plan view of an opening 1510 in the mask 800 having a width varying in the longitudinal direction in a step-like manner, which results in the widths of the openings in the levels varying accordingly.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device comprising:
    a three-dimensional structure including a plurality of levels, including levels 0 to N, where N is at least 2,
    in which level (i), for (i) equal to 0 through N−1, includes a landing area (i) having a length in a longitudinal direction and a width in a transverse direction, and
    in which level (i), for (i) equal to 1 through N, overlies level (i−1), and has an opening (i) which for (i) equal to 1 through N−1 is adjacent the landing area (i) on level (i), and extends over the landing area (i−1) on level (i−1) and for (i) greater than 1, over the opening (i−1) in level (i−1), the opening (i) having a distal longitudinal sidewall aligned with the distal longitudinal sidewall of opening (i−1) in level (i−1) and a proximal longitudinal sidewall defining a length of the opening (i) at least as large as the length of the landing area (i−1) plus the length of the opening (i−1), if any, and for (i) greater than 1, having transverse sidewalls aligned with the transverse sidewalls of opening (i−1) in level (i−1) and defining a width of the opening over landing area (i−1) at least as large as the width of landing area (i−1); and
    insulating fill in the openings in levels 1 to N, and conductors extending through the insulating fill in the openings to contact the landing areas on levels 0 to N−1.

2. The device of claim 1, wherein:
    for (i) greater than 1, distal longitudinal sidewall of the opening (i) is self-aligned with the distal longitudinal sidewall of opening (i−1) in level (i−1); and
    for (i) greater than 1, the transverse sidewalls of the opening (i) are self-aligned with the transverse sidewalls of opening (i−1) in level (i−1).

3. The device of claim 1, wherein levels in the plurality of levels comprise conductive layers.

4. The device of claim 1, further comprising a wiring layer overlying the plurality of levels including conductive lines contacting the conductors.

5. The device of claim 4, wherein said conductive lines couple the plurality of levels to decoding circuitry.

6. The device of claim 1, wherein levels in the plurality of levels include respective arrays of memory cells.

7. The device of claim 1, wherein:
    for (i) equal to 0 through N−1, level (i) includes an additional landing area (i) for contact with conductors; and
    for (i) equal to 1 through N, level (i) has an additional opening (i) which for (i) equal to 1 through N−1 is adjacent the additional landing area (i) on level (i), and extends over the additional landing area (i−1) on level (i−1), and for (i) greater than 1, over the additional opening (i−1) in level (i−1).

8. The device of claim 7, wherein for (i) equal to 1 through N−1, the landing area (i) and the additional landing area (i) are symmetrical about an axis perpendicular to both the longitudinal and transverse direction, and the opening (i) and additional opening (i) are symmetrical about said axis.

* * * * *